(12) United States Patent
Horinouchi et al.

(10) Patent No.: US 11,848,550 B2
(45) Date of Patent: Dec. 19, 2023

(54) SEMICONDUCTOR CIRCUIT BREAKER AND CIRCUIT BREAKING DEVICE

(71) Applicant: Mitsubishi Electric Corporation, Tokyo (JP)

(72) Inventors: Katsuhiko Horinouchi, Tokyo (JP); Tsuguhiro Takuno, Tokyo (JP); Tomoko Takasuka, Tokyo (JP); Satoshi Ishikura, Tokyo (JP); Hiroto Yuki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 519 days.

(21) Appl. No.: 17/256,663

(22) PCT Filed: Jul. 25, 2018

(86) PCT No.: PCT/JP2018/027901
§ 371 (c)(1),
(2) Date: Dec. 29, 2020

(87) PCT Pub. No.: WO2020/021656
PCT Pub. Date: Jan. 30, 2020

(65) Prior Publication Data
US 2021/0265831 A1  Aug. 26, 2021

(51) Int. Cl.
*H02H 3/08* (2006.01)
*H03K 17/08* (2006.01)
(Continued)

(52) U.S. Cl.
CPC ............. *H02H 3/08* (2013.01); *H03K 17/08* (2013.01); *H03K 17/13* (2013.01); *H03K 17/567* (2013.01)

(58) Field of Classification Search
CPC .... H02H 3/02–08; H02H 3/033; H02H 3/083; H02H 3/093; H02H 3/14;
(Continued)

(56) References Cited

U.S. PATENT DOCUMENTS 4,245,184 A * 1/1981 Billings ................. H03K 17/13
361/93.6
4,709,296 A 11/1987 Hung et al.
(Continued)

FOREIGN PATENT DOCUMENTS

EP         0016646 A1   10/1980
JP         50-32461 A    3/1975
(Continued)

OTHER PUBLICATIONS

Extended European search report dated Jun. 17, 2021, in corresponding European patent Application No. 18927476.4, 8 pages.
(Continued)

*Primary Examiner* — Tuan T Dinh
(74) *Attorney, Agent, or Firm* — XSENSUS LLP

(57) ABSTRACT

The semiconductor circuit breaker includes a semiconductor switch unit connected to an AC circuit, and a phase control unit that controls conduction and non-conduction of the semiconductor switch unit by the control signal. The phase control unit includes an accident detection unit to detect an accident based on a current detected from the AC circuit, a zero point detection unit to detect a current zero point based on the current detected from the AC circuit, and a control signal output unit to output the control signal for setting the semiconductor switch unit to be non-conductive when the accident detection unit detects the accident or when the zero point detection unit detects the current zero point in response to a command to cut off the current.

20 Claims, 10 Drawing Sheets

(51) Int. Cl.
*H03K 17/13* (2006.01)
*H03K 17/567* (2006.01)

(58) Field of Classification Search
CPC ............ H02H 3/20; H02H 3/24; H03K 17/08;
H03K 17/13; H03K 17/567; H03K
17/0828; H03K 17/6874
USPC ...... 361/88–90, 91.1, 91.2, 91.6, 91.7, 93.6;
363/96.03
See application file for complete search history.

(56) References Cited

U.S. PATENT DOCUMENTS

| | | | | |
|---|---|---|---|---|
| 5,258,885 | A * | 11/1993 | Hattori | H02H 3/05 361/88 |
| 5,600,233 | A * | 2/1997 | Warren | H05B 39/048 323/237 |
| 6,054,891 | A * | 4/2000 | Christiansen | H03K 17/18 327/438 |
| 2004/0156154 | A1* | 8/2004 | Lazarovich | H02H 3/08 361/42 |
| 2005/0030045 | A1* | 2/2005 | Deng | G01R 31/52 324/522 |
| 2011/0260531 | A1* | 10/2011 | Obayashi | B60L 1/003 903/930 |
| 2015/0229121 | A1* | 8/2015 | Davidson | H02H 9/043 361/54 |
| 2016/0065070 | A1* | 3/2016 | Noguchi | H03K 17/162 323/271 |
| 2016/0190791 | A1* | 6/2016 | Sim | H02H 3/087 361/93.6 |
| 2018/0045783 | A1* | 2/2018 | Wu | H02H 1/0007 |

FOREIGN PATENT DOCUMENTS

| | | |
|---|---|---|
| JP | 52-151819 A | 12/1977 |
| JP | 61-293115 A | 12/1986 |
| JP | 2008-072865 A | 3/2008 |
| JP | 2013-172603 A | 9/2013 |
| WO | 2021/210124 A1 | 10/2021 |

OTHER PUBLICATIONS

International Search Report and Written Opinion dated Aug. 28, 2018, received for PCT Application No. PCT/JP2018/027901, Filed on Jul. 25, 2018, 10 pages including English Translation.

* cited by examiner

10

SEMICONDUCTOR CIRCUIT BREAKER AND CIRCUIT BREAKING DEVICE

CROSS-REFERENCE TO RELATED APPLICATION

The present application is based on PCT filing PCT/JP2018/027901, filed Jul. 25, 2018, the entire contents of which are incorporated herein by reference.

TECHNICAL FIELD

The present invention relates to a semiconductor circuit breaker and a circuit breaking device that cut off a current using a semiconductor switch.

BACKGROUND ART

A circuit breaker provided in a power switchboard, a control board, or the like opens and closes a load current to be supplied to a load, and cuts off an accident current generated when an accident such as a short circuit or a ground fault occurs in the load or a power system connected thereto. In an alternating current (AC) power system, a mechanical circuit breaker such as a gas circuit breaker, a vacuum circuit breaker, or an airblast circuit breaker is generally used. In such a mechanical circuit breaker, a high-temperature discharge called an arc is generated when a current is cut off. Since the arc has a property that it does not extinguish unless a current value becomes zero, the mechanical circuit breaker in the AC power system cuts off the current at timing when the current value becomes zero (hereinafter referred to as a current zero point) that comes for each half cycle of an alternating current.

As a method for not generating a high-temperature arc, there is a method that uses a semiconductor circuit breaker instead of a mechanical circuit breaker. In the semiconductor circuit breaker, a semiconductor switch is quickly set to be non-conductive after an accident occurs to cut off an accident current without generating an arc. For example, PTL 1 discloses a semiconductor AC circuit breaker that uses a thyristor as a semiconductor switch, and, when a short circuit accident occurs, turns off the thyristor by discharging a precharged commutation capacitor.

However, a semiconductor circuit breaker using a thyristor, a triac, or the like as a semiconductor switch has a characteristic that a current is not cut off until it reaches a current zero point. Thus, when an accident current passes a peak of a current value and then reaches a current zero point, the accident current may exceed a withstand current of the semiconductor switch. Accordingly, it is necessary to use a semiconductor switch having a large withstand current, or to connect multiple semiconductor switches in parallel, causing an increase in the size and the cost of the semiconductor circuit breaker.

Hence, semiconductor circuit breakers using self-arc-extinguishing semiconductor switches such as a MOSFET, an IGBT, a power transistor, and the like, instead of semiconductor switches such as a thyristor, a triac, and the like, have been developed. Since these self-arc-extinguishing semiconductor switches are each controlled to be conductive or non-conductive by a control signal, a current can be cut off before reaching a withstand current of the semiconductor switch, prior to a current zero point. For example, PTL 2 discloses a semiconductor circuit breaker including a semiconductor switch unit that switches conduction and non-conduction between a power supply device and a load device based on a control signal, the semiconductor switch unit being cut off when a current detected by a current detector is determined to be more than or equal to a predetermined current threshold.

CITATION LIST

Patent Literature

PTL 1: Japanese Patent Laying-Open No. S50-032461
PTL 2: Japanese Patent Laying-Open No. 2013-172603

SUMMARY OF INVENTION

Technical Problem

However, in a semiconductor circuit breaker including a semiconductor switch controlled to be conductive or non-conductive by a control signal, when a current to be supplied to a load is cut off while a power system is operating normally, the current may be cut off at other than a current zero point. In a case where the load is an induction load such as a motor, if the current is cut off at other than the current zero point, a high surge voltage may be generated and damage the semiconductor switch. Accordingly, an instrument for suppressing generation of the surge voltage and a circuit for connecting the instrument are required, causing an increase in the size and the cost of the semiconductor circuit breaker.

The present invention has been made to solve the aforementioned problem, and an object thereof is to provide a semiconductor circuit breaker that quickly cuts off a current when an accident occurs, and cuts off the current while suppressing generation of a surge voltage when a power system is operating normally, and thereby can achieve reduced size and cost.

Solution to Problem

A semiconductor circuit breaker in accordance with the present invention includes a semiconductor switch unit connected to an AC circuit and controlled to be conductive or non-conductive based on a control signal, an accident detection unit to detect an accident based on a current detected from the AC circuit, a zero point detection unit to detect a current zero point based on the current detected from the AC circuit, and a control signal output unit to output the control signal for setting the semiconductor switch unit to be non-conductive when the accident detection unit detects the accident or when the zero point detection unit detects the current zero point in response to a command to cut off the current.

Further, a circuit breaking device in accordance with the present invention includes a semiconductor circuit breaker connected to branch lines branched from a bus connected to a power supply, and a current limiter connected in parallel with a master switch connected to the bus.

Advantageous Effects of Invention

According to the semiconductor circuit breaker in accordance with the present invention, when the accident is detected or when the current zero point is detected in response to the command to cut off the current, the control signal for setting the semiconductor switch unit to be non-conductive is output, and thereby the current flowing when the accident occurs can be cut off before reaching a withstand current of the semiconductor switch unit. Further, when a power system is normal, the current to be supplied to a load can be cut off while suppressing generation of a high surge voltage. Therefore, the size and the cost of the semiconductor circuit breaker can be reduced.

Further, according to the circuit breaking device in accordance with the present invention, the current limiter is connected in parallel with the master switch. Accordingly, when an accident occurs, the circuit breaking device can limit the current flowing from the power supply side toward the load, and the current can be immediately cut off by the semiconductor circuit breaker.

DESCRIPTION OF EMBODIMENTS

First Embodiment

Figure 1:
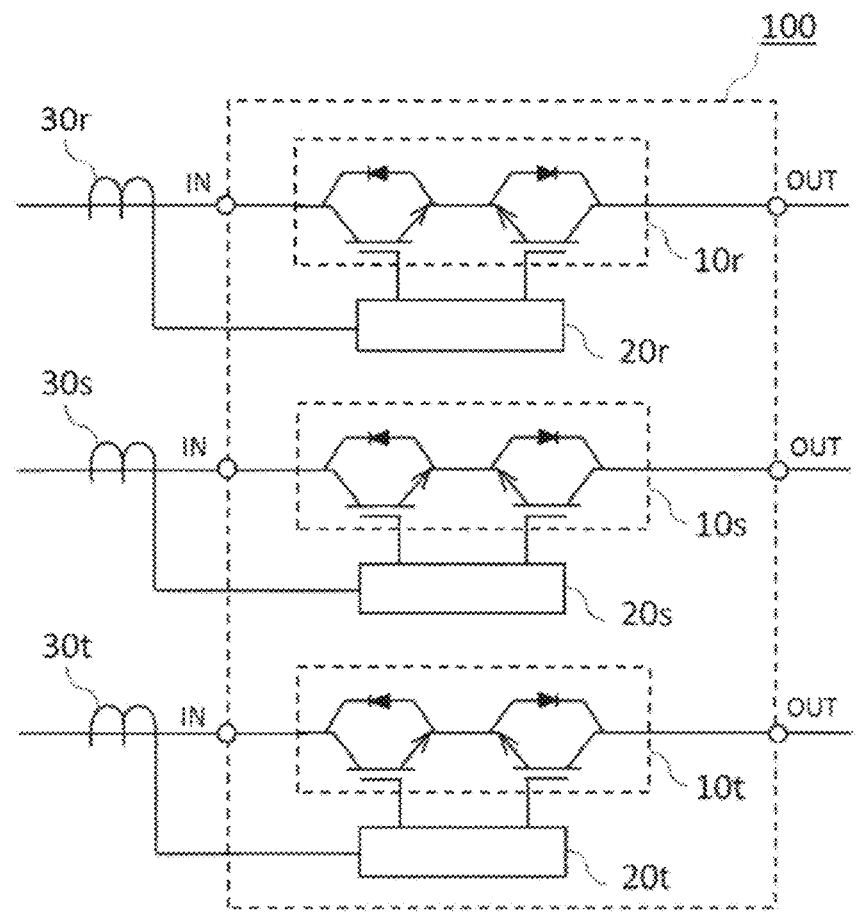
FIG. 1 is a schematic configuration diagram of a semiconductor circuit breaker in accordance with a first embodiment of the present invention.

FIG. 1 is a schematic configuration diagram showing a semiconductor circuit breaker in accordance with a first embodiment of the present invention. The present embodiment describes a semiconductor circuit breaker connected to a three-phase AC circuit including an r phase, an s phase, and a t phase, as an example. As shown in FIG. 1, a semiconductor circuit breaker 100 includes semiconductor switch units 10r, 10s, and 10t connected to the r phase, the s phase, and the t phase, respectively, and phase control units 20r, 20s, and 20t that control conduction and non-conduction of semiconductor switch units 10r, 10s, and 10t, respectively. Semiconductor circuit breaker 100 is connected between an AC power supply and a load, and current detectors 30r, 30s, and 30t that detect currents are provided for the respective phases.

In the following, the units having an identical name provided for the r phase, the s phase, and the t phase, respectively, shall have the same configuration and function, and when the same configuration and function of the units are described, the units are collectively described as semiconductor switch unit 10, phase control unit 20, or current detector 30.

Figure 2:
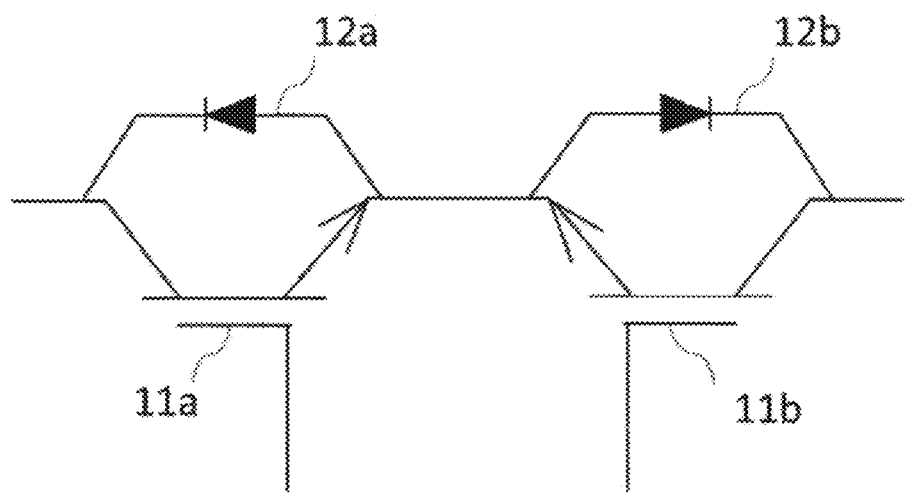
FIG. 2 is a schematic configuration diagram of a semiconductor switch unit of the semiconductor circuit breaker in accordance with the first embodiment of the present invention.

FIG. 2 is a schematic configuration diagram showing the semiconductor switch unit of the semiconductor circuit breaker in accordance with the first embodiment of the present invention. Conduction and non-conduction of semiconductor switch unit 10 are switched by a control signal outputted from phase control unit 20. As shown in FIG. 2, semiconductor switch unit 10 is an insulated gate bipolar transistor (IGBT), for example. Semiconductor switch unit 10 includes a first semiconductor element 11a, a first diode 12a connected in parallel with first semiconductor element 11a and passing a current in a direction opposite to that of a current in first semiconductor element 11a, a second semiconductor element 11b connected with first semiconductor element 11a in opposite directions, and a second diode 12b passing a current in a direction opposite to that of a current in second semiconductor element 11b.

Although an example where semiconductor switch unit 10 is an IGBT is described here, semiconductor switch unit 10 may be any unit controlled to be conductive or non-conductive by a control signal, and may be a gate turn-off thyristor (GTO), a gate commutated turn-off thyristor (GCT), or the like, for example.

Figure 3:
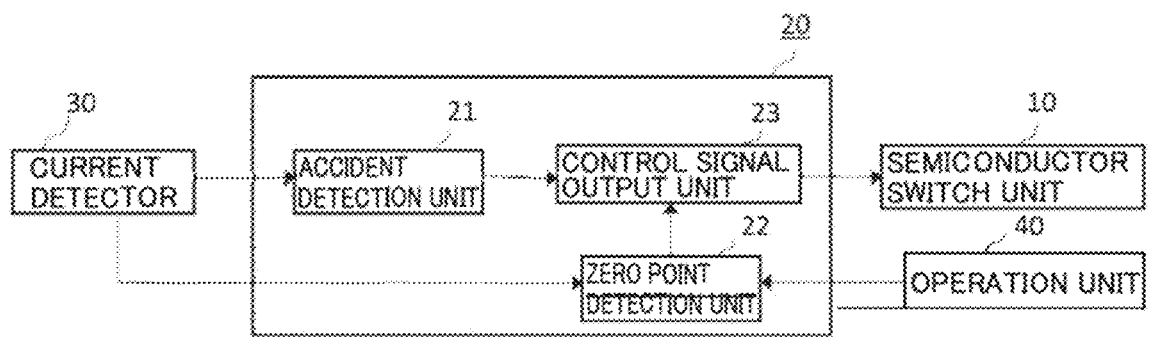
FIG. 3 is a schematic configuration diagram of the semiconductor circuit breaker in accordance with the first embodiment of the present invention.

FIG. 3 is a schematic configuration diagram showing the phase control unit of the semiconductor circuit breaker in accordance with the first embodiment of the present invention. As shown in FIG. 3, phase control unit 20 includes an accident detection unit 21 to detect an accident based on a current detected by current detector 30, a zero point detection unit 22 to detect a current zero point based on the current detected by current detector 30, and a control signal output unit 23 to output a control signal for setting semiconductor switch unit 10 to be non-conductive when the accident is detected or when the current zero point is detected in response to a command to cut off the current.

Accident detection unit 21 obtains a current signal S1 from current detector 30. When a current value or an amount of change of the current value is more than or equal to a predetermined threshold value, accident detection unit 21 determines that an accident has occurred, and outputs an accident detection signal S2 to control signal output unit 23. Here, the threshold value is set to less than or equal to a withstand current of semiconductor switch unit 10.

Zero point detection unit 22 obtains current signal S1 from current detector 30, detects a time when the current value is zero or a time when the sign of the current value is inverted, as a current zero point, and outputs a zero point detection signal S3 to control signal output unit 23. Zero point detection unit 22 may always detect the current zero point from current signal S1, or may start detection of the current zero point after it receives a command signal S5 that commands to cut off the current, from an operation unit 40 that is externally provided and can be operated by a user, for example. Here, operation unit 40 is a signal source such as a mechanical switch or another control instrument for outputting command signal S5, for example. Further, zero point detection unit 22 may start detection of the current zero point after it receives accident detection signal S2 that commands to cut off the current outputted from phase control unit 20 for another phase, as described later. Here, although FIG. 3 shows an example where command signal S5 from operation unit 40 is inputted into zero point detection unit 22, when zero point detection unit 22 always detects the current zero point, command signal S5 from operation unit 40 may be inputted into control signal output unit 23.

When control signal output unit 23 sets semiconductor switch unit 10 to be conductive, control signal output unit 23 outputs an ON control signal S4a to semiconductor switch unit 10, and when control signal output unit 23 sets semiconductor switch unit 10 to be non-conductive, control signal output unit 23 outputs an OFF control signal S4b to semiconductor switch unit 10. Control signal output unit 23 outputs OFF control signal S4b to semiconductor switch unit 10, in response to accident detection signal S2 outputted from accident detection unit 21. Further, control signal output unit 23 outputs OFF control signal S4b to semiconductor switch unit 10, in response to zero point detection signal S3 outputted from zero point detection unit 22.

Phase control unit 20 may be constituted by a digital circuit having an A/D converter, a CPU such as a microprocessor, and input/output circuits, or may be constituted by an analog circuit, for example.

Current detector 30 may be provided to semiconductor circuit breaker 100, or a CT provided to an AC circuit external to semiconductor circuit breaker 100 may be used, for example.

Figure 4:
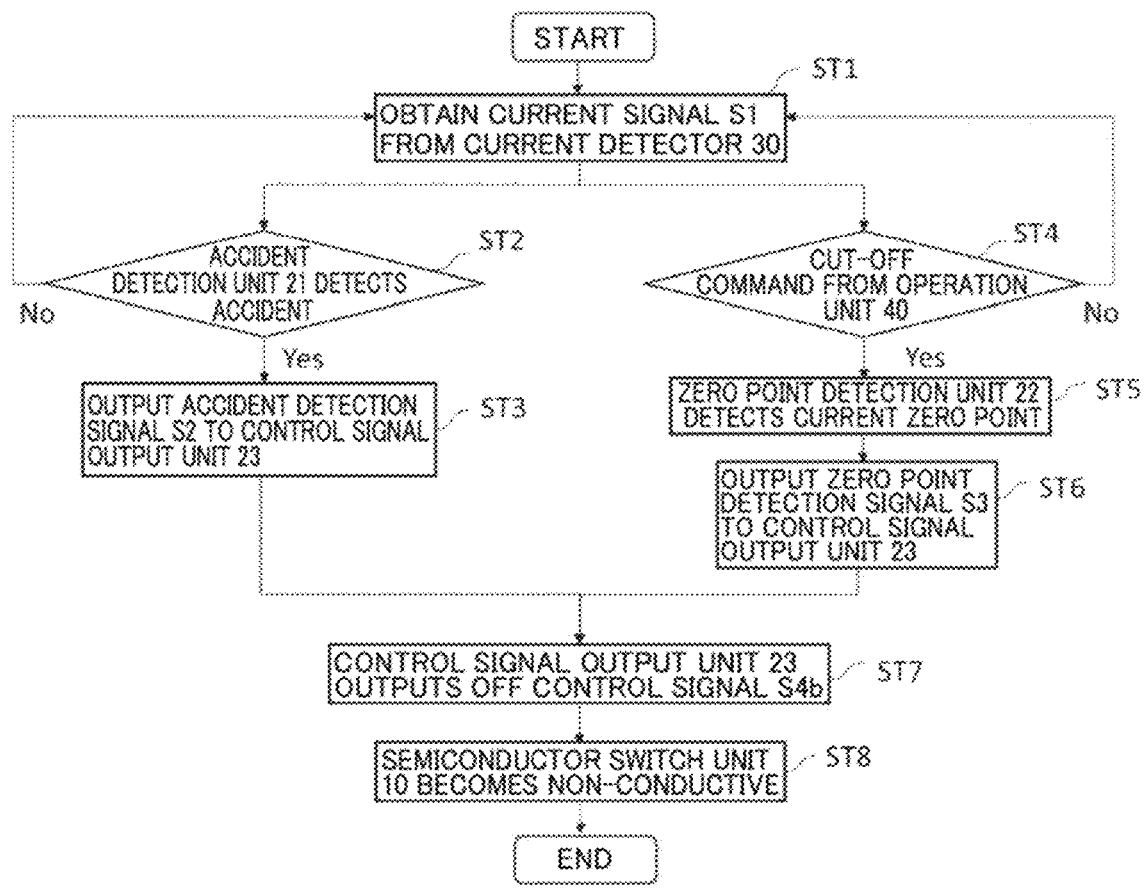
FIG. 4 is a flowchart showing an operation of the semiconductor circuit breaker in accordance with the first embodiment of the present invention.

Next, an operation of semiconductor circuit breaker 100 will be described. Here, phase control unit 20 shall control semiconductor switch unit 10 provided for each phase based on the current detected from current detector 30 provided for each phase. FIG. 4 is a flowchart showing an example of an operation of the semiconductor circuit breaker in accordance with the first embodiment of the present invention. Phase control unit 20 of semiconductor circuit breaker 100 obtains current signal S1 from current detector 30 (ST1).

Accident detection unit 21 determines whether or not a current value or an amount of change of the current value is more than or equal to a predetermined threshold value (ST2), based on obtained current signal S1. When the current value or the amount of change of the current value is more than or equal to the threshold value, accident detection unit 21 determines that an accident has occurred, and outputs accident detection signal S2 to control signal output unit 23 (ST3).

Further, when command signal S5 that commands to cut off the current is outputted to phase control unit 20 (ST4), zero point detection unit 22 detects a current zero point based on obtained current signal S1 (ST5). When the current zero point is detected, zero point detection unit 22 outputs zero point detection signal S3 to control signal output unit 23 (ST6).

In response to accident detection signal S2 or zero point detection signal S3, control signal output unit 23 outputs OFF control signal S4b for setting semiconductor switch unit 10 to be non-conductive, to semiconductor switch unit 10 (ST7).

When semiconductor switch unit 10 receives OFF control signal S4b outputted in response to accident detection signal S2, semiconductor switch unit 10 becomes non-conductive and cuts off the current before the current reaches the withstand current of semiconductor switch unit 10. Further, when semiconductor switch unit 10 receives OFF control signal S4b outputted in response zero point detection signal S3, semiconductor switch unit 10 becomes non-conductive at the detected current zero point, and cuts off the current (ST8). Here, becoming non-conductive at the current zero point also includes a case where semiconductor switch unit 10 becomes non-conductive after a delay time $\Delta td$ taken for signal processing in phase control unit 20 has elapsed from the detected current zero point.

Figure 5:
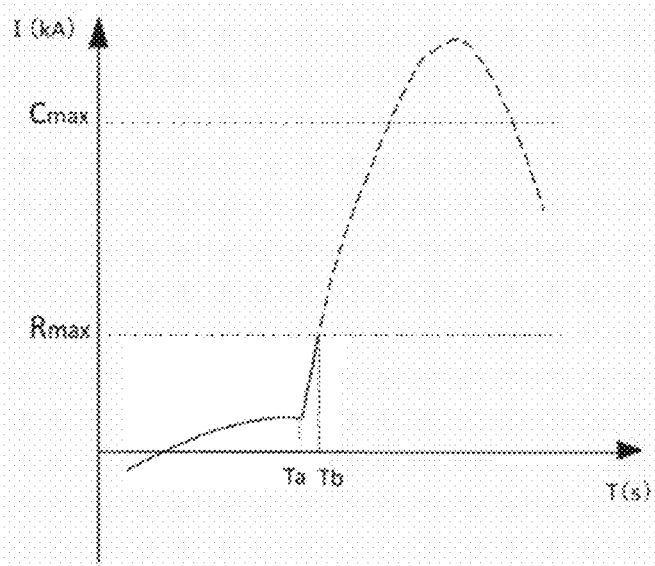
FIG. 5 is an explanatory diagram for explaining an operation of the semiconductor circuit breaker in accordance with the first embodiment of the present invention.

FIG. 5 is an explanatory diagram for explaining an operation of the semiconductor circuit breaker in accordance with the first embodiment of the present invention. In FIG. 5, the axis of ordinates represents the current value (kA), and the axis of abscissas represents time (s). As shown in FIG. 5, when a short circuit, a ground fault, or the like occurs in a power system, the current value and an amount of temporal change of the current value increase. After an accident occurs at a time Ta, semiconductor circuit breaker 100 in accordance with the present embodiment can determine that the accident has occurred, at a time Tb when a current value of more than or equal to a predetermined threshold value Rmax is detected, and can quickly cut off the current before the current reaches a withstand current Cmax of semiconductor switch unit 10, prior to the current zero point. Accordingly, there is no need to use semiconductor switch unit 10 having a large withstand current, or to connect semiconductor switch units 10 in parallel, and thus the size and the cost of semiconductor circuit breaker 100 can be reduced. In addition, by using semiconductor switch unit 10 controlled to be non-conductive by the control signal, there is no need to provide a circuit for superposing a reverse current from a precharged capacitor, and thus the size and the cost of semiconductor circuit breaker 100 can be reduced.

Further, in semiconductor circuit breaker 100 in accordance with the present embodiment, when the command to cut off the current is issued and zero point detection unit 22 detects the current zero point, control signal output unit 23 outputs OFF control signal S4b for setting semiconductor switch unit 10 to be non-conductive. This can suppress such a situation that, in a case where the load is an induction load such as a motor, for example, the current is cut off at other than the current zero point, in particular at a peak of a current value of an alternating current, and a high surge voltage corresponding to a product L×(dI/dt) of an inductance L of the load and an amount of temporal change dI/dt of a current I flowing through semiconductor switch unit 10 is generated.

Further, when an accident such as a short circuit or a ground fault occurs, semiconductor circuit breaker 100 is not influenced by an inductance component of the load, because it is separated from the load at the point of the accident in terms of the circuit. Thus, even when the current is cut off prior to the current zero point, a surge voltage due to the load is not generated.

Accordingly, there is no need to use semiconductor switch unit 10 having a high withstand voltage performance, or to use a lightning protector such as an arrester or a varistor that absorbs surge energy, in order to prevent semiconductor switch unit 10 from being damaged by a surge voltage, and thus the size and the cost of semiconductor circuit breaker 100 can be reduced.

Second Embodiment

Figure 6:
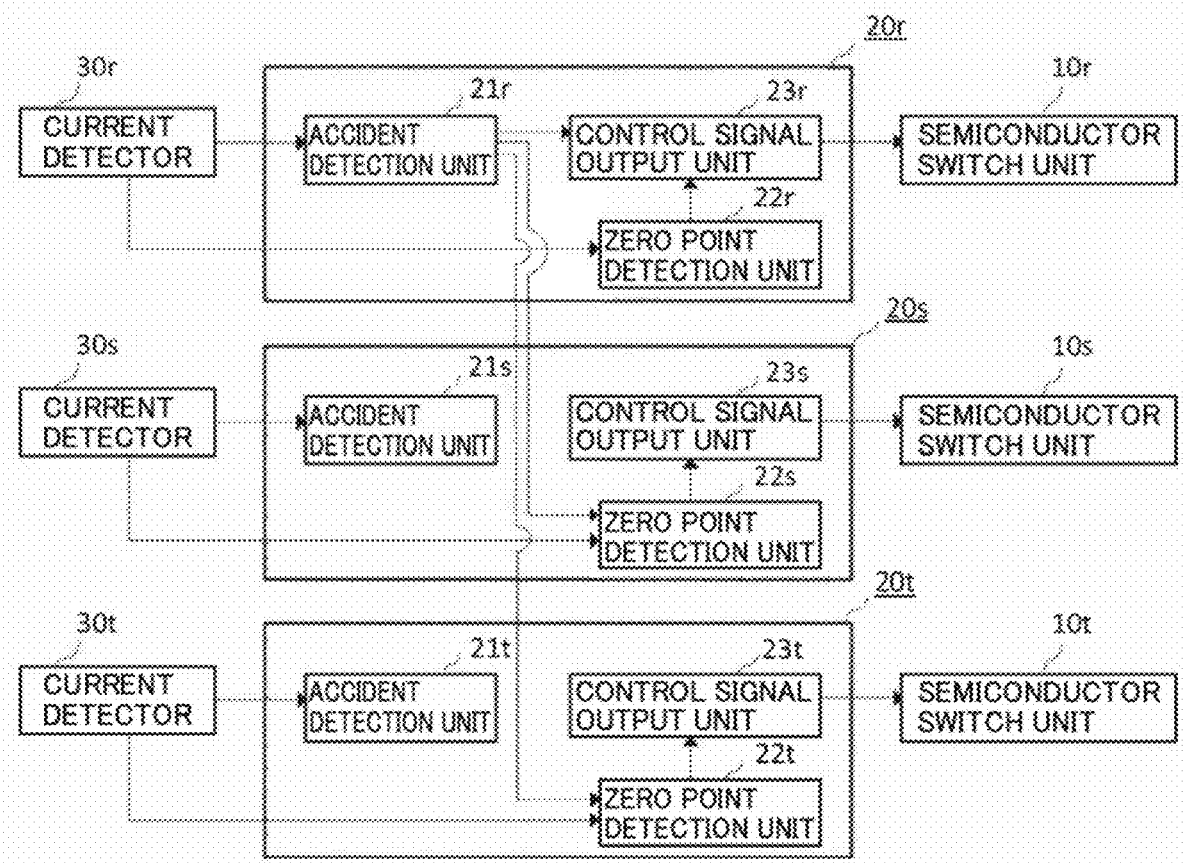
FIG. 6 is a schematic configuration diagram of a semiconductor circuit breaker in accordance with a second embodiment of the present invention.

FIG. 6 is a schematic configuration diagram of phase control units of a semiconductor circuit breaker in accordance with a second embodiment of the present invention. In the first embodiment, phase control units 20r, 20s, and 20t control semiconductor switch units 10r, 10s, and 10t, respectively, whereas in the present embodiment, phase control units 20r, 20s, and 20t are connected with one another, and when an accident occurs, phase control unit 20 for a phase in which the accident has occurred controls semiconductor switch units 10 for normal other phases. In the following, the description of the same features as those in the first embodiment will be omitted, and the difference therefrom will be mainly described.

As shown in FIG. 6, phase control units 20r, 20s, and 20t that control conduction and non-conduction of semiconductor switch units 10r, 10s, and 10t respectively provided for the r phase, the s phase, and the t phase are connected with one another to allow transmission and reception of signals. Here, in FIG. 6, transmission and reception of signals in a specific case described below are indicated by arrows, and transmission and reception of signals between accident detection unit 21s and control signal output unit 23s and between accident detection unit 21t and control signal output unit 23t are omitted. Further, although FIG. 6 shows an example where a signal from accident detection unit 21r is outputted to zero point detection units 22s and 22t for the other phases, when zero point detection unit 22 always detects a current zero point, the signal from accident detection unit 21r may be outputted to control signal output units 23s and 23t for the other phases.

Figure 7:
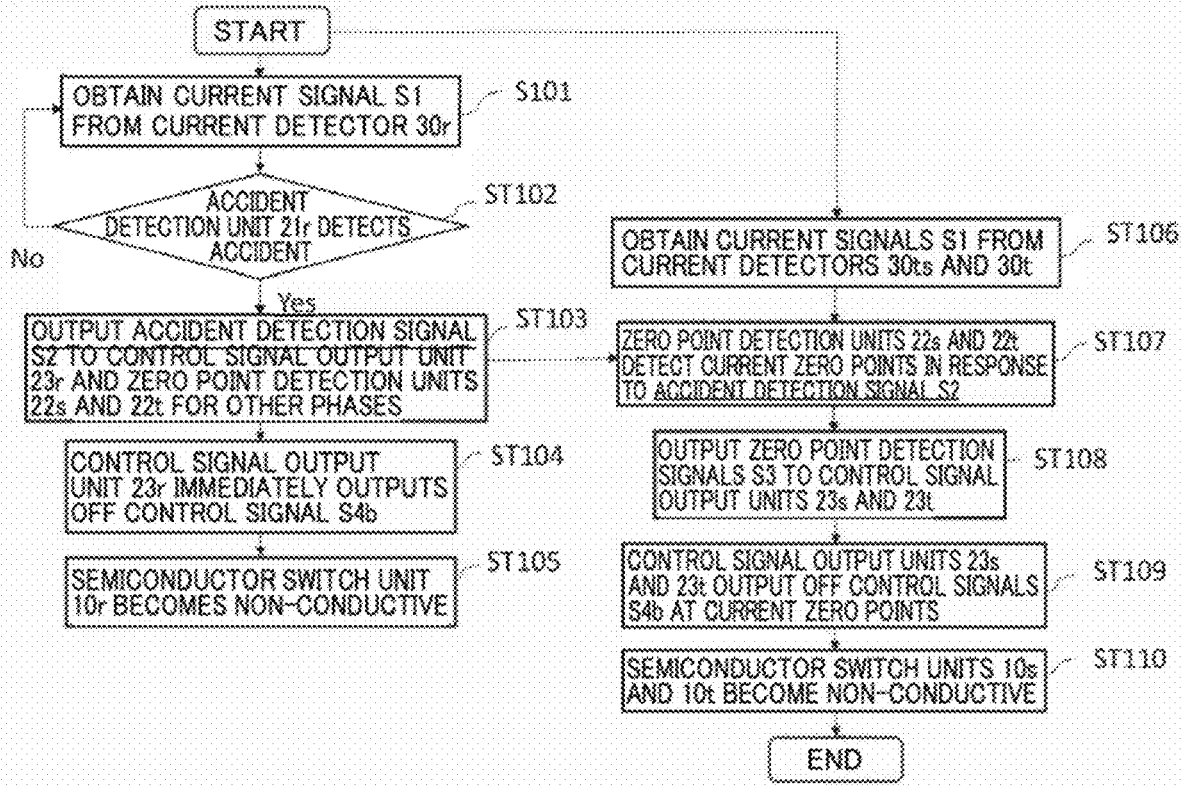
FIG. 7 is a flowchart showing an operation of the semiconductor circuit breaker in accordance with the second embodiment of the present invention.

First, a case where an accident occurs in one phase and other two phases are normal in a three-phase AC circuit will be described. As an example, it is assumed that an accident caused by a short circuit, a ground fault, or the like occurs in the r phase, and the s phase and the t phase are normal. FIG. 7 is a flowchart showing an example of an operation of the semiconductor circuit breaker in accordance with the second embodiment of the present invention.

Phase control unit 20r for the r phase obtains current signal S1 from current detector 30r that detects a current flowing in the r phase (ST101). Accident detection unit 21r for the r phase determines whether or not a current value or an amount of change of the current value is more than or equal to a predetermined threshold value (ST102), based on obtained current signal S1. When the current value or the amount of change of the current value is more than or equal to the threshold value, accident detection unit 21r for the r phase determines that an accident has occurred, and outputs accident detection signal S2 to each of control signal output unit 23r for the r phase and zero point detection units 22s and 22t for the s phase and the t phase (ST103).

In response to accident detection signal S2 from accident detection unit 21r for the r phase, control signal output unit 23r for the r phase outputs OFF control signal S4b for setting semiconductor switch unit 10 to be non-conductive, to semiconductor switch unit 10r for the r phase, (ST104). In response to OFF control signal S4b, semiconductor switch unit 10r for the r phase becomes non-conductive and cuts off the current before the current reaches the withstand current of semiconductor switch unit 10, prior to the current zero point (ST105).

Zero point detection units 22s and 22t for the s phase and the t phase obtain current signals S1 from current detectors 30s and 30t that detect currents flowing in the s phase and the t phase, respectively (ST106). Zero point detection units 22s and 22t for the s phase and the t phase receive accident detection signal S2 as a signal that commands to cut off the current, from accident detection unit 21r for the r phase, and detect current zero points based on current signals S1 obtained from the respective phases (ST107). Then, when zero point detection units 22s and 22t detect the current zero points, zero point detection units 22s and 22t output zero point detection signals S3 to control signal output units 23s and 23t for the s phase and the t phase, respectively (ST108).

In response to zero point detection signals S3, control signal output units 23s and 23t for the s phase and the t phase output OFF control signals S4b for setting semiconductor switch units 10s and 10t for the s phase and the t phase to be non-conductive (ST109). In response to OFF control signals S4b, semiconductor switch units 10s and 10t for the s phase and the t phase cut off the currents at the current zero points (ST110).

Figure 8:
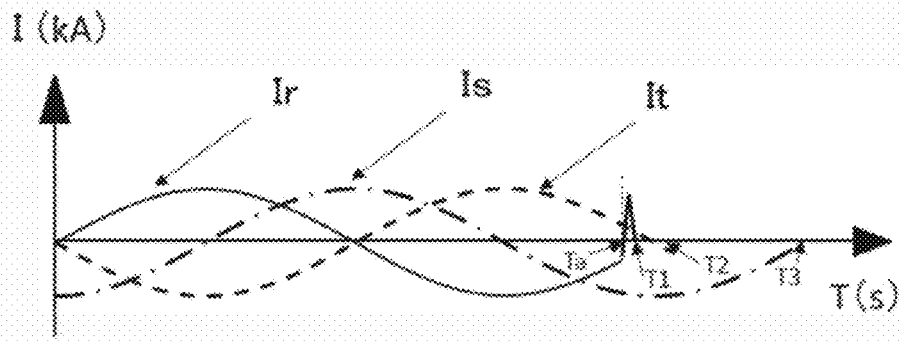
FIG. 8 is an explanatory diagram for explaining an operation of the semiconductor circuit breaker in accordance with the second embodiment of the present invention.

FIG. 8 is an explanatory diagram for explaining an example of an operation of the semiconductor circuit breaker in accordance with the second embodiment of the present invention. In FIG. 8, the axis of ordinates represents the current value (kA), and the axis of abscissas represents time (s). As shown in FIG. 8, it is assumed that currents Ir, Is, and It flow in the r phase, the s phase, and the t phase, respectively. In the r phase in which the accident has occurred, after the accident occurs at time Ta, OFF control signal S4b is outputted prior to the current zero point, and current Ir is cut off at a time T1 before reaching the withstand current of semiconductor switch unit 10r. In addition, in the normal s phase and t phase, after the accident is detected in the r phase, current Is for the s phase and current It for the t phase are cut off at a time T3 and a time T2, respectively, when the currents reach the respective current zero points.

Here, the description of an operation in a case where an accident occurs in the s phase, and the r phase and the t phase are normal, and an operation in a case where an accident occurs in the t phase, and the r phase and the s phase are normal is omitted, because the operations are the same as the operation described above. The order of the steps of the operation described above may be partially changed.

Figure 9:
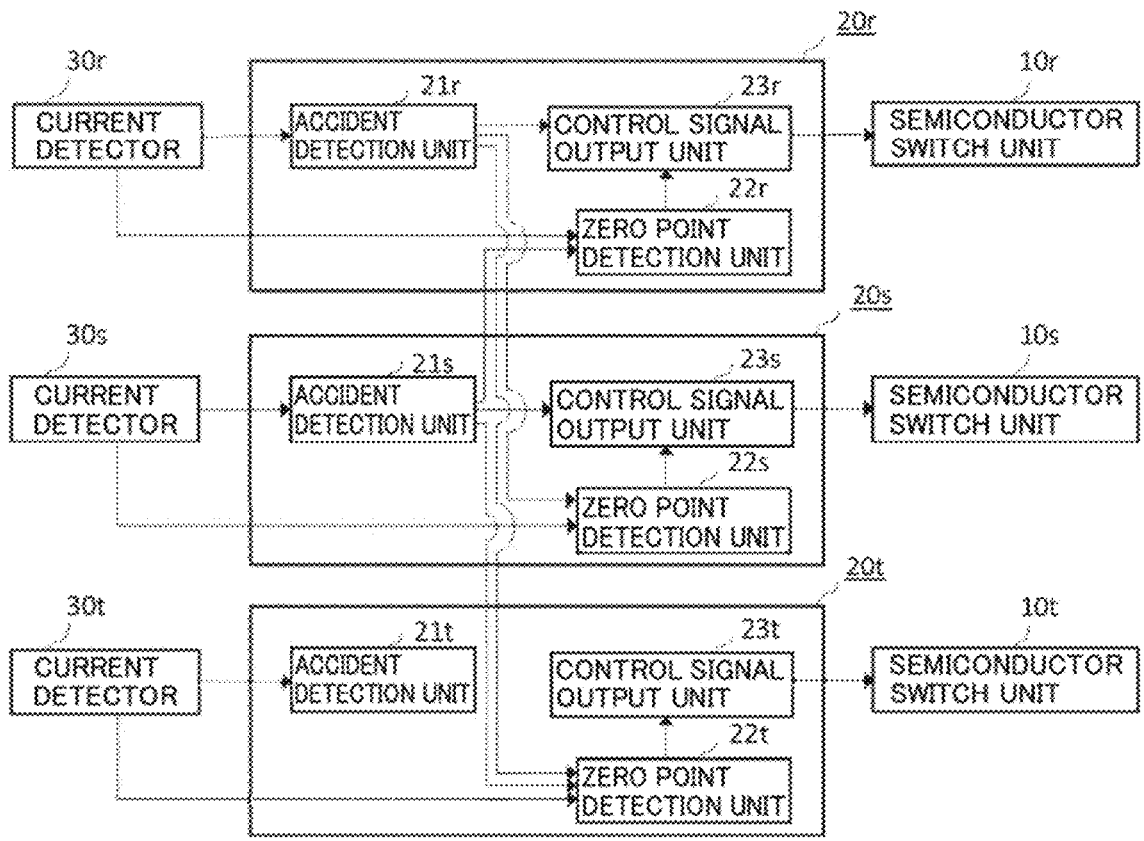
FIG. 9 is a schematic configuration diagram of the semiconductor circuit breaker in accordance with the second embodiment of the present invention.

Next, a case where accidents occur in two phases and one phase is normal will be described. As an example, a case where accidents caused by a short circuit, a ground fault, or the like occur in the r phase and the s phase, and the t phase is normal will be described. FIG. 9 is a schematic configuration diagram of the phase control units of the semiconductor circuit breaker in accordance with the second embodiment of the present invention. Here, in FIG. 9, transmission and reception of signals in a specific case described below are indicated by arrows, and transmission and reception of a signal between accident detection unit 21*t* and control signal output unit 23*t* is omitted.

Figure 10:
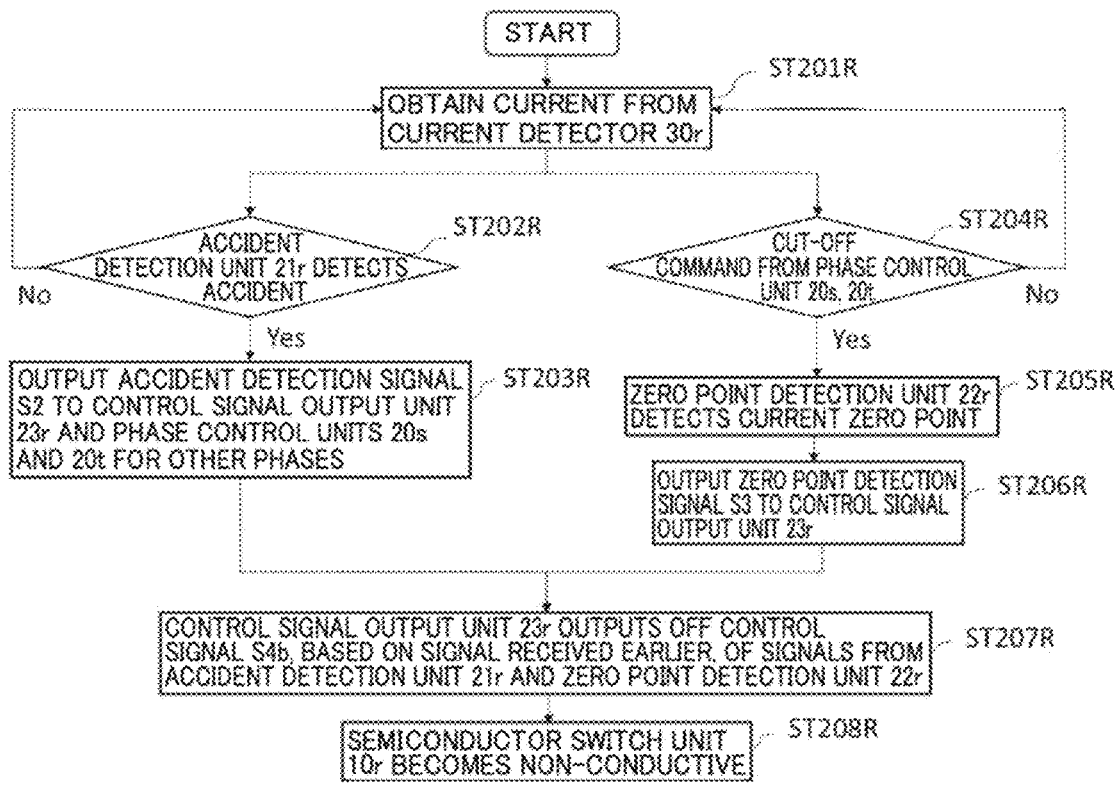
FIG. 10 is a flowchart showing an operation of the semiconductor circuit breaker in accordance with the second embodiment of the present invention.

FIG. 10 is a flowchart showing an operation of the phase control unit for the r phase of the semiconductor circuit breaker in accordance with the second embodiment of the present invention. Phase control unit 20*r* for the r phase obtains current signal S1 from current detector 30*r* for the r phase (ST201R). Accident detection unit 21*r* for the r phase determines whether or not a current value or an amount of change of the current value is more than or equal to a predetermined threshold value (ST202R), based on obtained current signal S1. When the current value or the amount of change of the current value is more than or equal to the threshold value, accident detection unit 21*r* for the r phase determines that an accident has occurred, and outputs accident detection signal S2 to control signal output unit 23*r* for the r phase and zero point detection units 22*s* and 22*t* for the s phase and the t phase (ST203R).

Similarly, phase control unit 20*s* for the s phase obtains current signal S1 from current detector 30*s* for the s phase. Accident detection unit 21*s* for the s phase determines whether or not a current value or an amount of change of the current value is more than or equal to a predetermined threshold value, based on obtained current signal S1. When the current value or the amount of change of the current value is more than or equal to the threshold value, accident detection unit 21*s* for the s phase determines that an accident has occurred, and outputs accident detection signal S2 to control signal output unit 23*s* for the s phase and zero point detection units 22*r* and 22*t* for the r phase and the t phase.

Zero point detection unit 22*r* for the r phase receives accident detection signal S2 as a signal that commands to cut off the current, from accident detection unit 21*s* for the s phase (ST204R). Then, zero point detection unit 22*r* detects a current zero point based on current signal S1 obtained from current detector 30*r* for the r phase (ST205R). Then, when zero point detection unit 22*r* detects the current zero point, zero point detection unit 22*r* outputs zero point detection signal S3 to control signal output unit 23*r* for the r phase (ST206R). In response to a signal received earlier, of accident detection signal S2 from accident detection unit 21*r* and zero point detection signal S3 from zero point detection unit 22*r*, control signal output unit 23*r* for the r phase outputs OFF control signal S4*b* to semiconductor switch unit 10*r* for the r phase (ST207R). In response to OFF control signal S4*b*, semiconductor switch unit 10*r* becomes non-conductive and cuts off the current (ST208R).

Similarly, zero point detection unit 22*s* for the s phase receives accident detection signal S2 as a signal that commands to cut off the current, from accident detection unit 21*r* for the r phase. Then, zero point detection unit 22*s* detects a current zero point based on current signal S1 obtained from current detector 30*s* for the s phase. Then, when zero point detection unit 22*s* detects the current zero point, zero point detection unit 22*s* outputs zero point detection signal S3 to control signal output unit 23*s* for the s phase. In response to a signal received earlier, of accident detection signal S2 from accident detection unit 21*s* and zero point detection signal S3 from zero point detection unit 22*s*, control signal output unit 23*s* for the s phase outputs OFF control signal S4*b* to semiconductor switch unit 10*s* for the s phase. In response to OFF control signal S4*b*, semiconductor switch unit 10*s* becomes non-conductive and cuts off the current.

Figure 11:
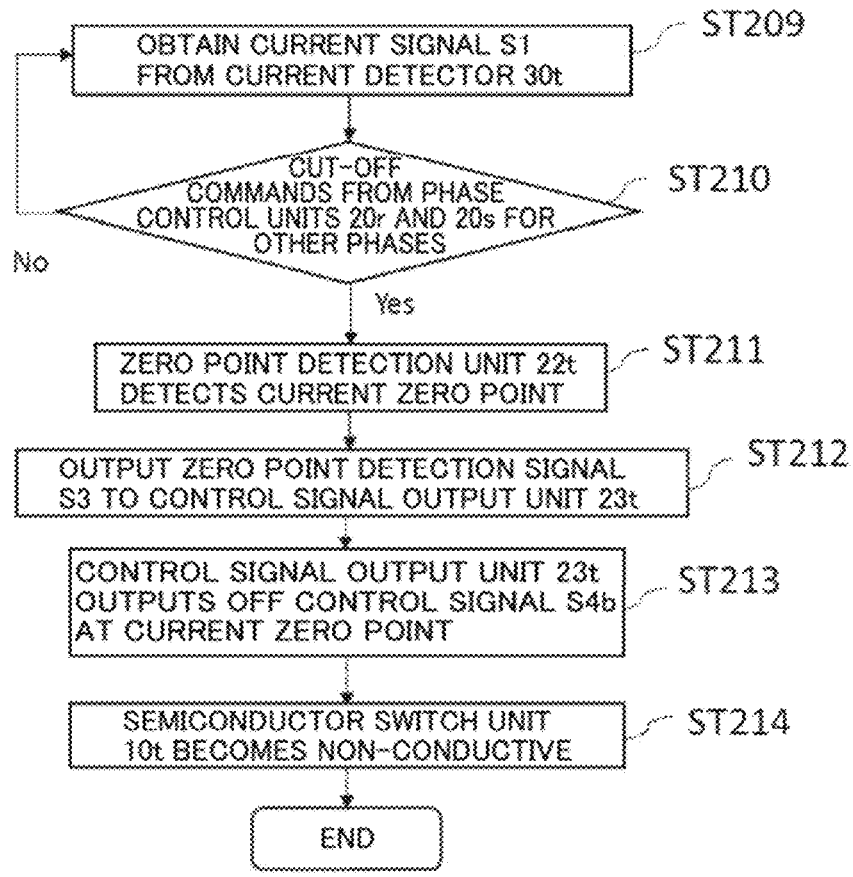
FIG. 11 is a flowchart showing an operation of the semiconductor circuit breaker in accordance with the second embodiment of the present invention.

FIG. 11 is a flowchart showing an operation of the phase control unit for the t phase of the semiconductor circuit breaker in accordance with the second embodiment of the present invention. Zero point detection unit 22*t* for the t phase obtains current signal S1 from current detector 30*t* for the t phase (ST209). Zero point detection unit 22*t* for the t phase receives accident detection signals S2 as signals that command to cut off the currents, from accident detection units 21*r* and 21*s* for the r phase and the s phase, respectively (ST210). In response to a signal received earlier, zero point detection unit 22*t* detects a current zero point based on current signal S1 obtained from current detector 30*t* for the t phase (ST211). Then, when zero point detection unit 22*t* detects the current zero point, zero point detection unit 22*t* outputs zero point detection signal S3 to control signal output unit 23*t* for the t phase (ST212). In response to zero point detection signal S3, control signal output unit 23*t* for the t phase outputs OFF control signal S4*b* to semiconductor switch unit 10*t* for the t phase (ST213). In response to OFF control signal S4*b*, semiconductor switch unit 10*t* for the t phase becomes non-conductive at the current zero point and cuts off the current (ST214).

Here, the description of an operation in a case where accidents occur in the s phase and the t phase, and the r phase is normal, and an operation in a case where accidents occur in the t phase and the r phase, and the s phase is normal is omitted, because the operations are the same as the operation described above. The order of the steps of the operation described above may be partially changed. Further, the operation ((ST201R) to (ST208R)) of phase control unit 20*r* for the r phase may be performed simultaneously with the operation of phase control unit 20*s* for the s phase.

As described above, when an accident is detected, semiconductor circuit breaker 100 in accordance with the present embodiment immediately cuts off the current before the current reaches the withstand current of semiconductor switch unit 10, and when a command to cut off the current is issued, semiconductor circuit breaker 100 cuts off the current at the current zero point, and thereby can suppress generation of a surge voltage. Further, in the present embodiment, in a case where accident detection unit 21 detects an accident in at least one phase, control signal output unit 23 for the phase in which the accident has been detected outputs OFF control signal S4*b* to semiconductor switch unit 10 for the phase in which the accident has been detected, and control signal output unit 23 for another phase different from the phase in which the accident has been detected outputs OFF control signal S4*b* to semiconductor switch unit 10 for the other phase when zero point detection unit 22 for the other phase detects the current zero point in response to the command to cut off the current from accident detection unit 21 for the phase in which the accident has been detected.

Thereby, semiconductor switch unit 10 for the phase in which the accident has occurred becomes non-conductive immediately after the accident is detected, and semiconductor switch unit 10 for the normal other phase becomes non-conductive at the current zero point detected after the accident is detected. By setting semiconductor switch unit 10 for the normal phase to be non-conductive at the current zero point as described above, an accident current flowing in the phase in which the accident has occurred can be prevented from flowing into the normal other phase, while suppressing generation of a surge voltage.

Third Embodiment

In the first embodiment, when zero point detection unit 22 detects a current zero point, control signal output unit 23 outputs the control signal for setting semiconductor switch unit 10 to be non-conductive. In contrast, in the present embodiment, based on a detected current, a time when the current will reach a subsequent current zero point is estimated, and the control signal for setting semiconductor switch unit 10 to be non-conductive is outputted when the current reaches the estimated subsequent current zero point, considering delay time Δtd resulting from a circuit constituting phase control unit 20. In the following, the description of the same features as those in the first embodiment will be omitted, and the difference therefrom will be mainly described.

Figure 12:
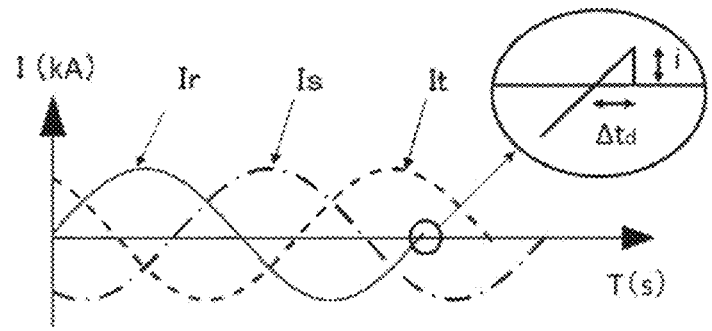
FIG. 12 is an explanatory diagram for explaining an operation of a semiconductor circuit breaker in accordance with a third embodiment of the present invention.

FIG. 12 is an explanatory diagram for explaining an example of an operation of a semiconductor circuit breaker in accordance with a third embodiment of the present invention. In FIG. 12, the axis of ordinates represents the current value (kA), and the axis of abscissas represents time (s). As shown in FIG. 12, when zero point detection unit 22 detects a current zero point and OFF control signal S4b for setting semiconductor switch unit 10 to be non-conductive is outputted, current Ir, Is, or It flowing in each phase may not be cut off exactly at the detected current zero point, and may be cut off after delay time Δtd has elapsed from the detected current zero point. In a case where an internal circuit of phase control unit 20 is constituted by a digital circuit using an A/D converter and a CPU, delay time Δtd corresponds to a delay time resulting from the sampling rate of the A/D converter and the processing time of the CPU, for example. In a case where the internal circuit of phase control unit 20 is constituted by an analog circuit, delay time Δtd corresponds to a delay time resulting from the delay of analog signal processing in the internal circuit.

Zero point detection unit 22 estimates a subsequent current zero point, from the cycle of the detected current zero point, for example. Here, the subsequent current zero point may be a current zero point at a time several cycles later estimated from the current detected at present. Further, zero point detection unit 22 estimates delay time Δtd taken until control signal output unit 23 outputs the control signal. Then, zero point detection unit 22 outputs zero point detection signal S3 at a time earlier than an estimated time when the current will reach the current zero point, by delay time Δtd. In response to zero point detection signal S3, control signal output unit 23 outputs OFF control signal S4b to semiconductor switch unit 10 when the current reaches the estimated subsequent current zero point.

As described above, when an accident is detected, semiconductor circuit breaker 100 in accordance with the present embodiment immediately cuts off the current before the current reaches the withstand current of semiconductor switch unit 10, and when a command to cut off the current is issued, semiconductor circuit breaker 100 cuts off the current at the current zero point, and thereby can suppress generation of a surge voltage. Further, in the present embodiment, semiconductor circuit breaker 100 has a configuration of estimating time Tc when the current will reach the subsequent current zero point, and outputting zero point detection signal S3 at the time earlier than estimated time Tc by delay time Δtd. This configuration can reduce the influence of delay time Δtd taken from when phase control unit 20 detects the current zero point to when it outputs OFF control signal S4b.

As shown in FIG. 12, when delay time Δtd is generated in a period from when the current zero point is detected to when semiconductor switch unit 10 is actually cut off, a minute current i flows during delay time Δtd. In the case where the load is an induction load, when an attempt is made to cut off current i to be supplied to the load, a surge voltage corresponding to the value of L×(di/dt) represented by the product of inductance component L of the load and an amount of temporal change di/dt of current i is generated. Further, when a circuit from the load to semiconductor circuit breaker 100 has a floating capacitance C, the circuit has a surge impedance $Z=\sqrt{L/C}$, and thereby a surge voltage corresponding to iZ is generated.

Since generation of these surge voltages can be suppressed by estimating the time when the current will reach the current zero point and reducing the influence of delay time Δtd, an instrument for protecting semiconductor switch unit 10 and a circuit for connecting the instrument are not required, and thus the size and the cost of semiconductor circuit breaker 100 can be further reduced.

Figure 13:
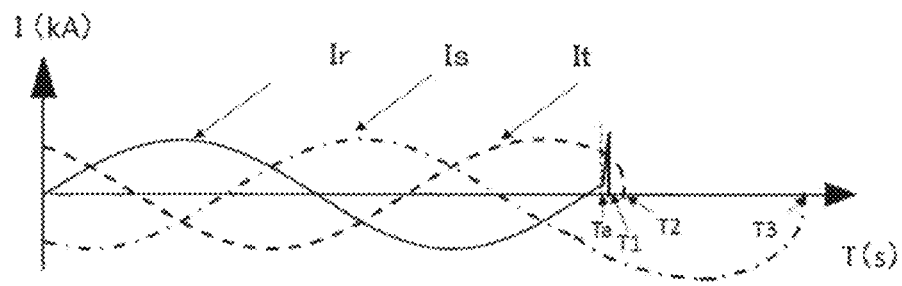
FIG. 13 is an explanatory diagram for explaining an operation of the semiconductor circuit breaker in accordance with the third embodiment of the present invention.

It should be noted that, when an accident occurs in a phase in the three-phase AC circuit, for example, it is further preferable to estimate the time of a subsequent current zero point in each of normal other phases by analyzing a transient current waveform. FIG. 13 is an explanatory diagram for explaining an operation of the semiconductor circuit breaker in accordance with the third embodiment of the present invention. In FIG. 13, the axis of ordinates represents the current value (kA), and the axis of abscissas represents time (s). As shown in FIG. 13, an accident occurs in the r phase, for example, and as a result, currents Is and It flowing in normal other s phase and t phase may have current waveforms different from typical cyclic current waveforms.

Zero point detection unit 22 outputs zero point detection signal S3 when the current reaches the subsequent current zero point estimated by analyzing the transient current waveform after the accident occurs. The transient current waveform after the accident occurs is analyzed by fitting by a sine function, or is analyzed by polynomial approximation using a least-square method, for example. Here, zero point detection unit 22 may output zero point detection signal S3 earlier than estimated time Tc when the current will reach the subsequent current zero point, by delay time Δtd.

By estimating the subsequent current zero point by analyzing the transient current waveform after the accident occurs as described above, even when an accident occurs in a phase, and as a result, the cyclic time interval to the subsequent current zero point changes in each of the other phases, the current flowing in each of the normal other phases can be cut off at the current zero point, and generation of a surge voltage can be further suppressed.

Fourth Embodiment

Figure 14:
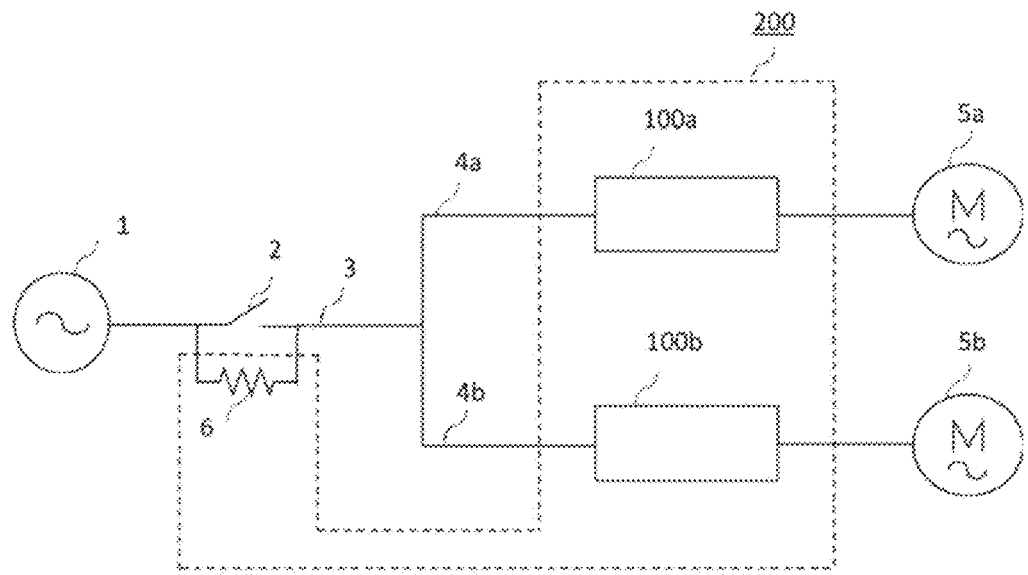
FIG. 14 is a schematic configuration diagram of a power system to which a circuit breaking device in accordance with a fourth embodiment of the present invention is applied.

FIG. 14 is a schematic configuration diagram showing a power system to which a circuit breaking device in accordance with a fourth embodiment of the present invention is applied. In the following, the description of the same features as those in the first embodiment will be omitted, and the difference therefrom will be mainly described. As shown in FIG. 14, in the power system, a master switch 2 is connected to a bus 3 connected to a power supply 1 such that master switch 2 is connected in series with power supply 1, and branch lines 4a and 4b branched into two are provided to bus 3 on a side opposite to the power supply 1 side of master switch 2. Induction motors 5a and 5b as loads are connected to branch lines 4a and 4b, and power is supplied from power supply 1.

Power supply 1 is a common external power generation facility, for example. Master switch 2 is a mechanical circuit breaker or a semiconductor circuit breaker, for example. Although FIG. 14 shows an example where the loads are induction motors 5a and 5b, the loads may be induction loads or resistance loads such as motors, reactors, and transformers, for example.

Circuit breaking device 200 includes semiconductor circuit breakers 100a and 100b connected to branch lines 4a and 4b branched from bus 3 connected to power supply 1, and a current limiter 6 connected in parallel with master switch 2 connected to bus 3. When an accident occurs in the power system, current limiter 6 in circuit breaking device 200 limits a current flowing from the power supply 1 side toward induction motors 5a and 5b serving as the loads. Current limiter 6 is a resistor or a reactor, for example.

Here, although FIG. 14 shows an example where semiconductor circuit breakers 100a and 100b are connected to branch lines 4a and 4b, respectively, a circuit breaker provided to one of branch lines 4a and 4b may be a mechanical circuit breaker. In addition, although FIG. 14 shows an example where two branch lines 4a and 4b are provided, more branch lines, such as three or four, for example, may be provided. In addition, although branch lines 4a and 4b are each indicated by one line, in the case of a three-phase AC circuit, branch lines 4a and 4b are each composed of three lines.

In circuit breaking device 200 in accordance with the present embodiment, semiconductor circuit breaker 100 is provided to at least one of branch lines 4a and 4b branched from bus 3 connected to power supply 1. Accordingly, when an accident is detected, semiconductor circuit breaker 100 immediately cuts off the current before the current reaches the withstand current of semiconductor switch unit 10, and when a command to cut off the current is issued, semiconductor circuit breaker 100 cuts off the current at the current zero point, and thereby can suppress a surge voltage. Further, in the present embodiment, circuit breaking device 200 includes current limiter 6 connected in parallel with master switch 2 connected to bus 3. Accordingly, when an accident occurs in at least one of branch lines 4a and 4b, current limiter 6 can limit the current flowing from the power supply 1 side toward induction motors 5a and 5b serving as the loads, and semiconductor circuit breaker 100 can immediately cut off the current.

Further, circuit breaking device 200 includes semiconductor circuit breaker 100. Accordingly, when an accident occurs in at least one of branch lines 4a and 4b, induction motor 5a or 5b connected to normal branch line 4a or 4b acts as a generator to prevent the current from flowing from normal branch line 4a or 4b to branch line 4a in which the accident has occurred.

Figure 15:
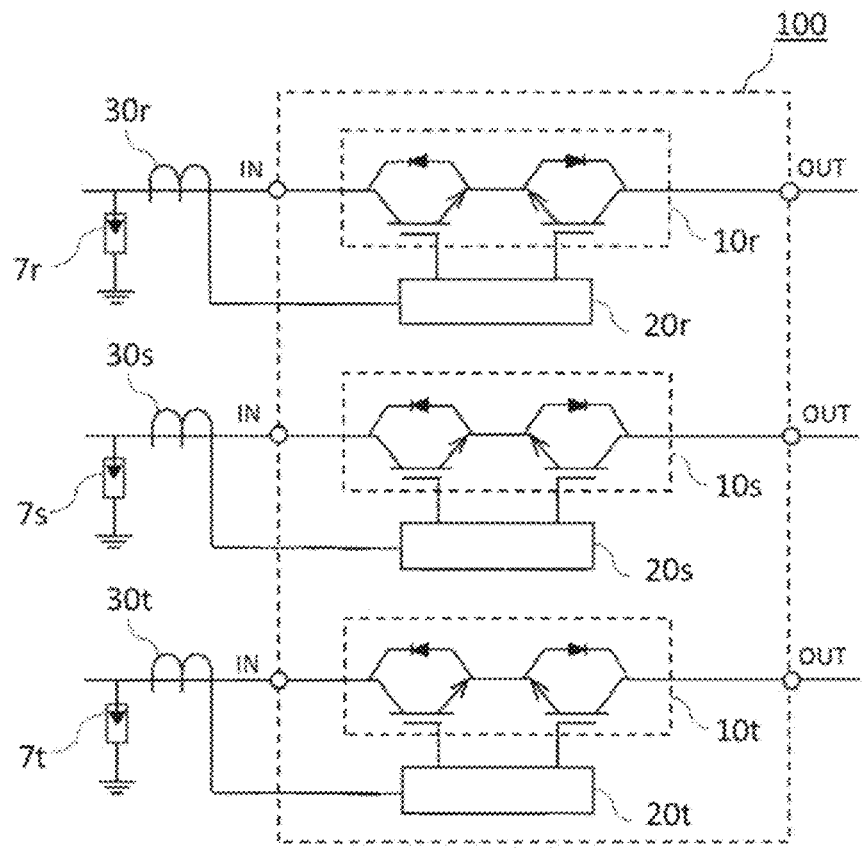
FIG. 15 is a schematic configuration diagram of a semiconductor circuit breaker in accordance with the fourth embodiment of the present invention.
Figure 16:
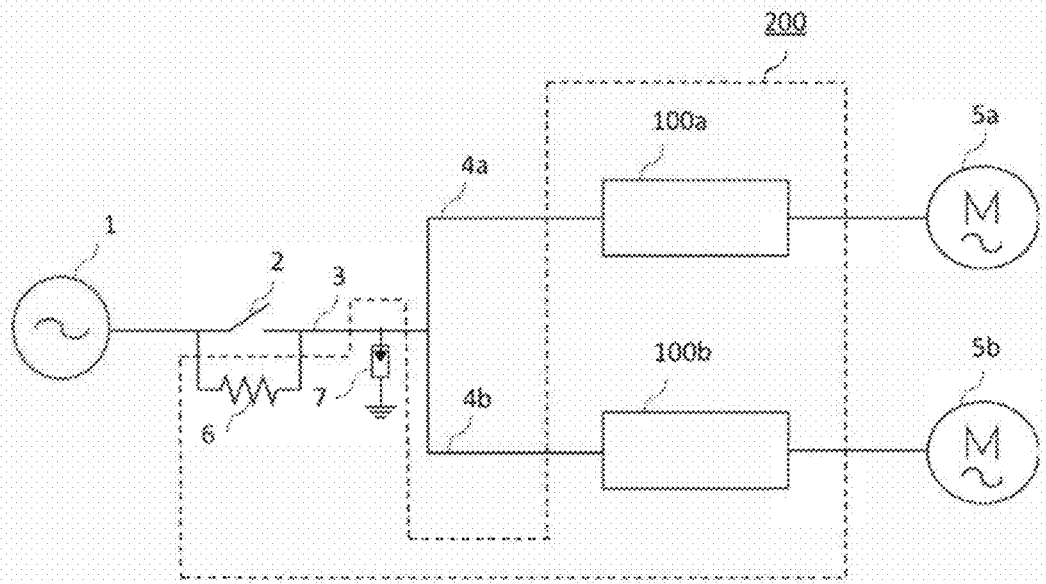
FIG. 16 is a schematic configuration diagram of a power system to which the circuit breaking device in accordance with the fourth embodiment of the present invention is applied.

It should be noted that, although it is described in the first to fourth embodiments that semiconductor circuit breaker 100 can suppress generation of a surge voltage due to the inductance component of the load and thus there is no need to provide a lightning protector, for the purpose of protection from a surge resulting from an inductance component of the AC power supply, lightning, and the like instead of the inductance component of the load, lightning protectors 7r, 7s, and 7t may be provided on the IN side of semiconductor circuit breaker 100 for the respective phases of the three-phase AC circuit, as shown in FIG. 15. Further, as shown in FIG. 16, in circuit breaking device 200, at least one lightning protector 7 may be provided to bus 3 which is a branched portion, instead of providing lightning protector 7 to each of semiconductor circuit breakers 100a and 100b provided to branch lines 4a and 4b. Even with such a configuration, the effect of protection from a surge resulting from the inductance component of the AC power supply, lightning, and the like can be sufficiently achieved, and cost reduction can be achieved when compared with the case of providing lightning protector 7 to each of semiconductor circuit breakers 100.

Fifth Embodiment

Figure 17:
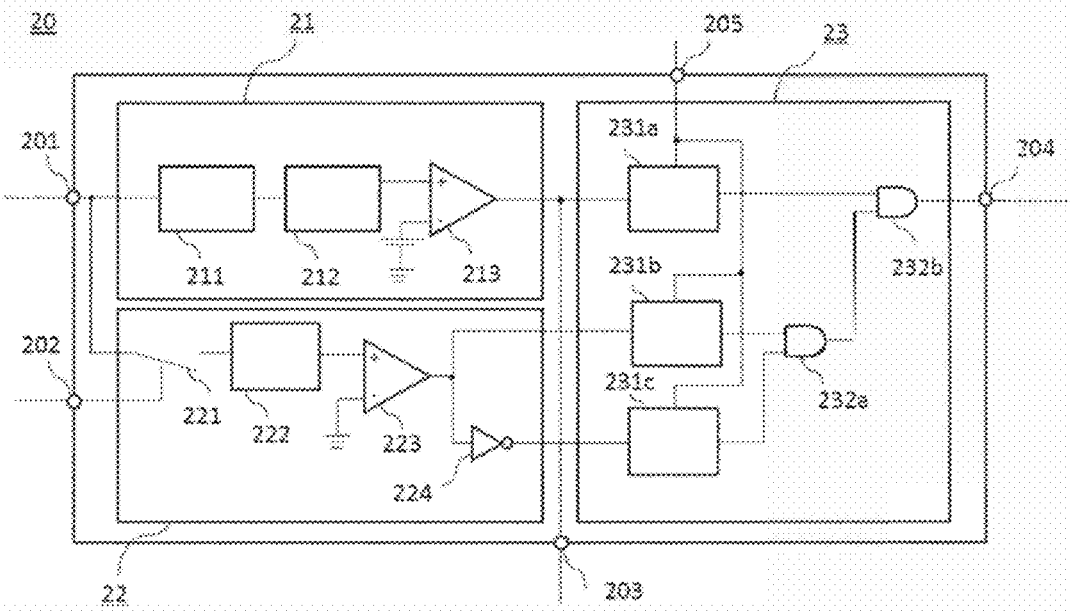
FIG. 17 is a schematic configuration diagram of a phase control unit of a semiconductor circuit breaker in accordance with a fifth embodiment of the present invention.

The present embodiment describes an example of a detailed configuration of phase control unit 20 of semiconductor circuit breaker 100. FIG. 17 is a schematic configuration diagram of a phase control unit of a semiconductor circuit breaker in accordance with a fifth embodiment of the present invention.

In the following, it is assumed that semiconductor switch unit 10 is controlled to become conductive in response to a true logic signal H, and to become non-conductive in response to a false logic signal L.

As shown in FIG. 17, phase control unit 20 includes accident detection unit 21, zero point detection unit 22, and control signal output unit 23. Further, phase control unit 20 includes a current detection terminal 201, an external signal terminal 202, an accident signal terminal 203, a control signal terminal 204, and a reset signal terminal 205. Current detection terminal 201 is connected to current detector 30, external signal terminal 202 is connected to operation unit 40, accident signal terminal 203 is connected to phase control unit 20 for another phase, and control signal terminal 204 is connected to semiconductor switch unit 10. For each of these terminals, two or more terminals may be provided, if necessary.

Phase control unit 20 obtains current signal S1 from current detector 30, and inputs current signal S1 to each of accident detection unit 21 and zero point detection unit 22 through current detection terminal 201.

Accident detection unit 21 includes an amplifier 211, a rectifier circuit 212, and a comparator 213. Current signal S1 inputted into accident detection unit 21 is converted into a voltage signal having an amplitude with an appropriate magnitude and amplified by amplifier 211. The voltage signal amplified by amplifier 211 is rectified by rectifier circuit 212 and converted into an amplitude signal indicating the magnitude of the amplitude of an alternating current. Comparator 213 compares the amplitude signal with a predetermined threshold value for determining whether or not an accident has occurred, and when the amplitude signal is more than or equal to the threshold value, comparator 213 determines that an accident has occurred. Here, it is assumed that accident detection unit 21 determines whether or not an accident has occurred, by comparing both of a positive current value and a negative current value of the alternating current with one threshold value.

When comparator 213 determines that an accident has occurred, accident detection unit 21 outputs false logic signal L as accident detection signal S2 to control signal output unit 23. In addition, accident detection unit 21 outputs false logic signal L to phase control unit 20 for the other phase through accident signal terminal 203.

Zero point detection unit 22 includes a switch 221, an amplifier 222, a comparator 223, and a NOT circuit 224. Here, switch 221 may be constituted by not only a mechanical switch, but also an electronic switch without having a movable part, or a circuit that performs the same operation.

Switch 221 is generally non-conductive, and current signal S1 inputted into zero point detection unit 22 is cut off by switch 221. Switch 221 becomes conductive by an external signal inputted through external signal terminal 202, and current signal S1 is inputted into amplifier 222. Here, examples of the external signal include command signal S5 that commands to cut off the current outputted from operation unit 40, accident detection signal S2 that commands to cut off the current outputted from phase control unit 20 for the other phase, and the like.

Amplifier 222 converts current signal S1 into a voltage signal having an amplitude with an appropriate magnitude. Comparator 223 compares the voltage signal amplified by amplifier 222 with a zero potential, and determines whether the amplified voltage signal is positive or negative. When the voltage signal is positive, comparator 223 outputs true logic signal H, and when the voltage signal is negative, comparator 223 outputs false logic signal L.

True logic signal H or false logic signal L outputted from comparator 223 is branched into two, one of the two branched signals is directly outputted to control signal output unit 23, and the other of the two branched signals is logically inverted through NOT circuit 224 and is outputted to control signal output unit 23. Thereby, zero point detection unit 22 can output both of a current zero point at which the current changes from positive to negative and a current zero point at which the current changes from negative to positive, as zero point detection signals S3.

Control signal output unit 23 includes three latches 231a, 231b, and 231c, and two AND circuits 232a and 232b. In latches 231a, 231b, and 231c, when an inputted logic signal changes from true to false, output is held at false logic signal L, and when the inputted logic signal changes from false to true, output is held at true logic signal H.

False logic signal L outputted when accident detection unit 21 detects the accident is inputted into latch 231a, and output is held. This prevents such a situation that, after the accident occurs and the current is cut off, semiconductor switch unit 10 becomes conductive without removing the cause of the accident, and an accident current flows again.

The signal outputted by zero point detection unit 22 without through NOT circuit 224 is inputted into latch 231b, and the signal outputted by zero point detection unit 22 through NOT circuit 224 is inputted into latch 231c. In latch 231b, output is held at false logic signal L to correspond to the current zero point at which the current changes from positive to negative. In addition, in latch 231c, output is held at false logic signal L to correspond to the current zero point at which the current changes from negative to positive.

AND circuit 232a obtains a logical conjunction of a signal outputted by latch 231b and a signal outputted by latch 231c. In addition, AND circuit 232b obtains a logical conjunction of a signal outputted by AND circuit 232a and a signal outputted by latch 231a. Thereby, when at least any one of latches 231a, 231b, and 231c outputs false logic signal L, AND circuit 232b outputs false logic signal L as OFF control signal S4b for setting semiconductor switch unit 10 to be non-conductive.

A reset signal is inputted into each of latches 231a, 231b, and 231c through reset signal terminal 205. By inputting the reset signal, latches 231a, 231b, and 231c are reset, false logic signal L for setting semiconductor switch unit 10 to be non-conductive is canceled, and semiconductor switch unit 10 is set to be conductive, after removal of the accident, or before restart after a normal stop.

As described above, when an accident is detected, semiconductor circuit breaker 100 in accordance with the present embodiment immediately cuts off the current before the current reaches the withstand current of semiconductor switch unit 10, and when a command to cut off the current is issued, semiconductor circuit breaker 100 cuts off the current at the current zero point, and thereby can suppress generation of a surge voltage.

Further, in the present embodiment, semiconductor circuit breaker 100 has a simple configuration including accident detection unit 21 having amplifier 211, rectifier circuit 212, and comparator 213, zero point detection unit 22 having amplifier 222, comparator 223, and NOT circuit 224, and control signal output unit 23 having three latches 231a, 231b, and 231c and two AND circuits 232a and 232b.

Since the delay time of signal transmission in latches 231a, 231b, and 231c, NOT circuit 224, and AND circuits 232a and 232b is about 100 ns, if an element having a delay time of about 1 μm is selected as amplifier 222 or comparator 223, for example, delay time Δtd taken from when the current passes the current zero point to when semiconductor switch unit 10 becomes non-conductive is about 2 μm to 3 μm. By constituting zero point detection unit 22 and control signal output unit 23 as described above, the current can be cut off in a very short time, when compared with the cycle of the alternating current of a commercial power supply.

For example, when the entire delay time, including the delay time of a gate drive circuit of semiconductor switch unit 10 typically connected to control signal output unit 23, is estimated as 5 μm, the current value of the current cut off after the delay time has elapsed since the detection of the current zero point can be smaller than a peak value of the amplitude thereof by about five orders of magnitude.

Sixth Embodiment

Figure 18:
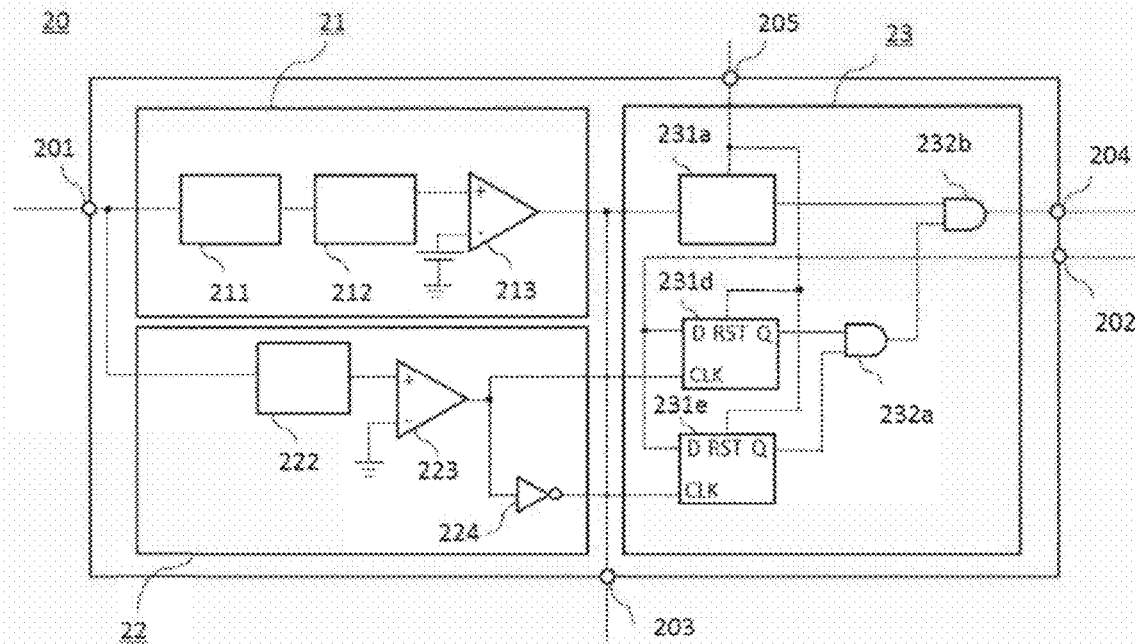
FIG. 18 is a schematic configuration diagram of a phase control unit of a semiconductor circuit breaker in accordance with a sixth embodiment of the present invention.

The present embodiment describes an example of a detailed configuration of phase control unit 20 of semiconductor circuit breaker 100. FIG. 18 is a schematic configuration diagram of a phase control unit of a semiconductor circuit breaker in accordance with a sixth embodiment of the present invention. In the fifth embodiment, zero point detection unit 22 generally cuts off current signal S1 by switch 221, and when it receives a command to cut off the current, zero point detection unit 22 closes switch 221 to become conductive, and starts detection of a current zero point. In contrast, in the present embodiment, zero point detection unit 22 always detects a current zero point. In the following, the description will be given with the same features as those in the fifth embodiment being omitted.

Phase control unit 20 obtains current signal S1 from current detector 30, and inputs current signal S1 to each of accident detection unit 21 and zero point detection unit 22 through current detection terminal 201.

Accident detection unit 21 receives signal S1, and determines whether or not an accident has occurred. When accident detection unit 21 determines that an accident has occurred, accident detection unit 21 outputs false logic signal L as accident detection signal S2 to control signal output unit 23, or outputs false logic signal L from accident signal terminal 203 to phase control unit 20 for another phase.

Zero point detection unit 22 includes amplifier 222, comparator 223, and NOT circuit 224. Current signal S1 is always inputted into zero point detection unit 22. Current signal S1 is converted into a voltage signal having an amplitude with an appropriate magnitude and amplified by amplifier 222. Comparator 223 compares the amplified voltage signal with the zero potential, and determines whether the amplified voltage signal is positive or negative. When the voltage signal is positive, comparator 223 outputs true logic signal H, and when the voltage signal is negative, comparator 223 outputs false logic signal L.

True logic signal H or false logic signal L outputted from comparator 223 is branched into two, one of the two branched signals is directly outputted to control signal output unit 23, and the other of the two branched signals is logically inverted through NOT circuit 224 and is outputted to control signal output unit 23.

Control signal output unit 23 includes latch 231a, D latches 231d and 231e, and AND circuits 232a and 232b. The signal outputted by accident detection unit 21 is inputted into latch 231a.

D latches 231d and 231e each include a CLK terminal into which a signal is inputted from zero point detection unit 22, a D terminal into which a signal is inputted through external signal terminal 202, and a Q terminal from which a signal is outputted. When a logic signal inputted into the CLK terminal changes from false to true or from true to false, D latches 231d and 231e each output the signal inputted into the D terminal from the Q terminal, and keep holding the signal to be outputted from the Q terminal until the logic signal inputted into the CLK terminal changes from false to true or from true to false next time.

The signal outputted by zero point detection unit 22 without through NOT circuit 224 is inputted into the CLK terminal of D latch 231d, and the signal outputted by zero point detection unit 22 through NOT circuit 224 is inputted into the CLK terminal of D latch 231e. In addition, an external signal outputted by external operation unit 40 or phase control unit 20 for the other phase through external signal terminal 202 is inputted into the D terminal of D latch 231d.

D latch 231d outputs the external signal inputted into the D terminal to Q terminal at a current zero point at which the current changes from positive to negative, based on the signal inputted into the CLK terminal. In addition, D latch 231e outputs the external signal inputted into the D terminal to the Q terminal at a current zero point at which the current changes from negative to positive. Here, the external signal is command signal S5 that commands to cut off the current outputted from external operation unit 40 or phase control unit 20 for the other phase, and false logic signal L is outputted to the Q terminal.

AND circuit 232a obtains a logical conjunction of a signal outputted by D latch 231d and a signal outputted by D latch 231e. In addition, AND circuit 232b obtains a logical conjunction of a signal outputted by AND circuit 232a and a signal outputted by accident detection unit 21. Thereby, when at least any one of latch 231a and D latches 231d and 231e outputs false logic signal L, AND circuit 232b outputs false logic signal L as OFF control signal S4b for setting semiconductor switch unit 10 to be non-conductive.

A reset signal is inputted from reset signal terminal 205 into each of latch 231a and D latches 231d and 231e. By inputting the reset signal after removal of the accident or before restart after a normal stop, latch 231a and D latches 231d and 231e are reset, output held in each latch is canceled, and semiconductor switch unit 10 is set to be conductive.

As described above, when an accident is detected, semiconductor circuit breaker 100 in accordance with the present embodiment immediately cuts off the current before the current reaches the withstand current of semiconductor switch unit 10, and when a command to cut off the current is issued, semiconductor circuit breaker 100 cuts off the current at the current zero point, and thereby can suppress generation of a surge voltage.

Further, in the present embodiment, semiconductor circuit breaker 100 has a simple configuration including accident detection unit 21 having amplifier 211, rectifier circuit 212, and comparator 213, zero point detection unit 22 having amplifier 222, comparator 223, and NOT circuit 224, and control signal output unit 23 having latch 231a, two D latches 231d and 231e, and two AND circuits 232a and 232b.

Since the delay time of signal transmission in latch 231a, D latches 231d and 231e, NOT circuit 224, and AND circuits 232a and 232b is about 100 ns, if an element having a delay time of about 1 μm is selected as an amplifier or a comparator, a delay time taken from when the current passes the current zero point to when control signal output unit 23 outputs the control signal is about 2 μm to 3 μm. Thus, the current can be cut off in a very short time, when compared with the cycle of the alternating current of a commercial power supply. Further, in the present embodiment, control signal output unit 23 includes D latches 231d and 231e. Accordingly, when the current zero point is always detected, semiconductor switch unit 10 can be set to be non-conductive at the current zero point, in response to the external signal that commands to cut off the signal.

It should be noted that, although the fifth and sixth embodiments each describe an example where accident detection unit 21 compares a positive or negative current value with one threshold value to determine whether or not an accident has occurred, a configuration different from that described above may be adopted, depending on the method of determining whether or not an accident has occurred.

Figure 19:
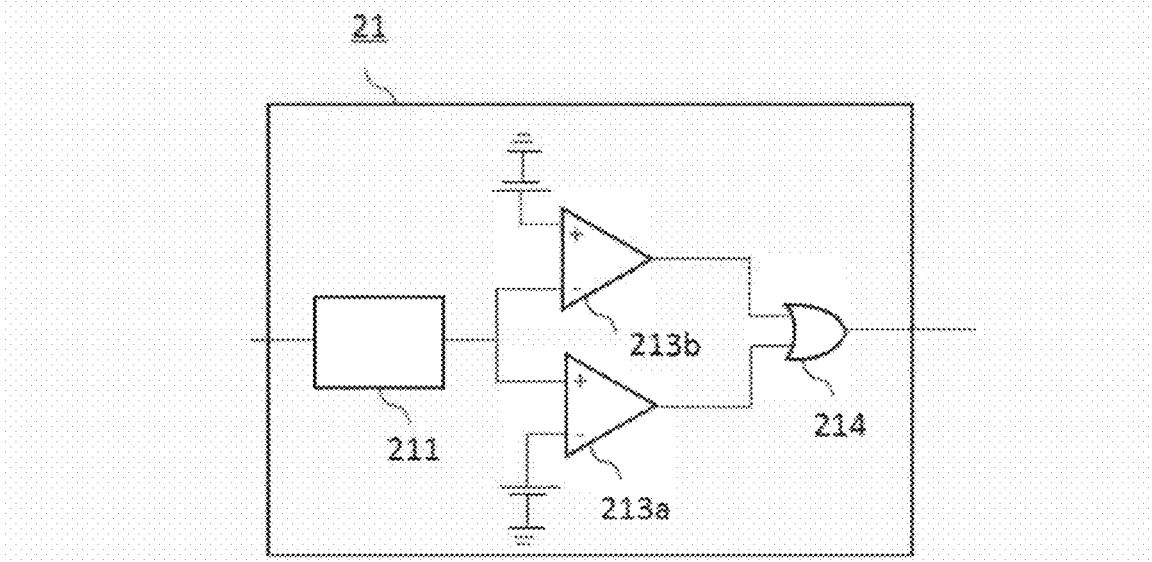
FIG. 19 is a schematic configuration diagram of a phase control unit of the semiconductor circuit breaker in accordance with the sixth embodiment of the present invention.

FIG. 19 is a schematic configuration diagram showing another example of the accident detection unit of the semiconductor circuit breaker in accordance with the sixth embodiment of the present invention. As shown in FIG. 19, accident detection unit 21 includes amplifier 211, two comparators 213a and 213b connected in parallel, and an OR circuit 214. Current signal S1 inputted into accident detection unit 21 is converted into a voltage signal having an amplitude with an appropriate magnitude by the amplifier. The amplified voltage signal is branched into two, one of the two branched signals is compared with a threshold value for a positive current value by comparator 213a, and the other of the two branched signals is compared with a threshold value for a negative current value by comparator 213b. When the voltage signal is more than or equal to the threshold value for the positive current value in comparator 213a or is less than or equal to the threshold value for the negative current value in comparator 213b, OR circuit 214 determines that an accident has occurred, and outputs false logic signal L.

With this configuration, accident detection unit 21 can determine whether or not an accident has occurred, using two different threshold values for the positive current value and the negative current value.

Figure 20:
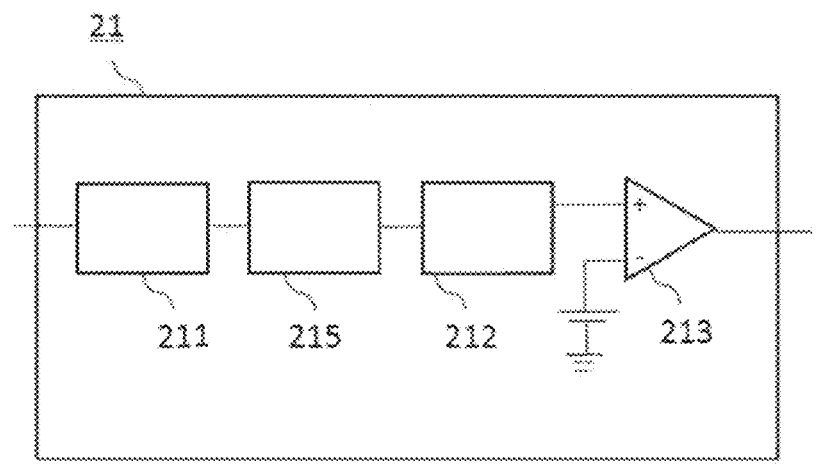
FIG. 20 is a schematic configuration diagram of a phase control unit of the semiconductor circuit breaker in accordance with the sixth embodiment of the present invention.

FIG. 20 is a schematic configuration diagram showing another example of the accident detection unit of the semiconductor circuit breaker in accordance with the sixth embodiment of the present invention. As shown in FIG. 20, accident detection unit 21 includes amplifier 211, a differential circuit 215, rectifier circuit 212, and comparator 213. Current signal S1 inputted into accident detection unit 21 is converted into a voltage signal having an amplitude with an appropriate magnitude by the amplifier. Differential circuit 215 differentiates the amplified voltage signal to calculate an amount of change of the voltage signal. Rectifier circuit 212 rectifies the amount of change of the voltage signal to obtain an absolute value of the magnitude of change. Comparator 213 compares an amount of change of the voltage signal with a predetermined threshold value. When the magnitude of change is more than or equal to the predetermined threshold value, comparator 213 determines that an accident has occurred, and outputs false logic signal L.

With this configuration, accident detection unit 21 can determine whether or not an accident has occurred, depending on whether or not the amount of change of the voltage signal is more than or equal to the threshold value.

Figure 21:
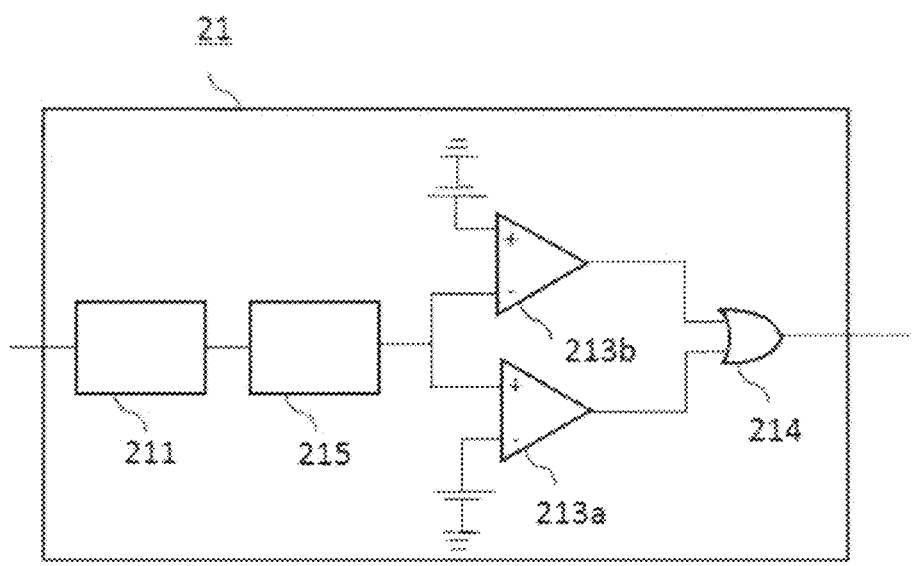
FIG. 21 is a schematic configuration diagram of a phase control unit of the semiconductor circuit breaker in accordance with the sixth embodiment of the present invention.

FIG. 21 is a schematic configuration diagram showing another example of the accident detection unit of the semiconductor circuit breaker in accordance with the sixth embodiment of the present invention. As shown in FIG. 21, accident detection unit 21 includes amplifier 211, differential circuit 215, two comparators 213a and 213b connected in parallel, and OR circuit 214. Current signal S1 inputted into accident detection unit 21 is converted into a voltage signal having an amplitude with an appropriate magnitude by amplifier 211. Differential circuit 215 differentiates the amplified voltage signal to calculate an amount of change of the voltage signal. The amount of change of the voltage signal is branched into two, one of the two branched amounts is compared with a threshold value for an amount of change of a positive current value by comparator 213a, and the other of the two branched amounts is compared with a threshold value for an amount of change of a negative current value by comparator 213b. When the voltage signal is more than or equal to the threshold value for the amount of change of the positive current value in comparator 213a or is less than or equal to the threshold value for the amount of change of the negative current value in comparator 213b, OR circuit 214 determines that an accident has occurred, and outputs false logic signal L.

With this configuration, accident detection unit 21 can determine whether or not an accident has occurred, using two different threshold values for the amount of change of the positive current value and the amount of change of the negative current value.

It should be noted that, although the first to sixth embodiments each describe the semiconductor circuit breaker connected to the three-phase AC circuit as an example, the semiconductor circuit breaker may be connected to another circuit, and may be connected to a single-phase three-wire circuit, for example.

In addition, although the first to sixth embodiments each describe an example where phase control units 20r, 20s, and 20t are provided separately, functions to be performed by phase control units 20r, 20s, and 20t may be performed by one control unit.

In addition, a plurality of components disclosed in the first to sixth embodiments may be combined as appropriate within the scope not departing from the gist of the present invention.

REFERENCE SIGNS LIST

1: power supply; 2: master switch; 3: bus; 4a, 4b: branch line; 5a, 5b: induction motor; 6: current limiter; 7: lightning protector; 10: semiconductor switch unit; 20: phase control unit; 21: accident detection unit; 22: zero point detection unit; 23: control signal output unit; 30: current detector; 40: operation unit; 100: semiconductor circuit breaker; 200: circuit breaking device; 201: current detection terminal; 202: external signal terminal; 203: accident signal terminal; 204: control signal terminal; 205: reset signal terminal; 211: amplifier; 212: rectifier circuit; 213: comparator; 214: OR circuit; 215: differential circuit; 221: switch; 222: amplifier; 223: comparator; 224: NOT circuit; 231a, 231b, 231c: latch; 231d, 231e: D latch; 232a, 232b: AND circuit.

The invention claimed is:

1. A semiconductor circuit breaker comprising:
   semiconductor switch circuitry connected to an AC circuit, and having a semiconductor element controlled to be conductive or non-conductive by a control signal;
   accident detection circuitry to detect an accident based on a current detected from the AC circuit;
   zero point detection circuitry to detect a current zero point based on the current detected from the AC circuit; and
   control signal output circuitry to
      output the control signal for setting the semiconductor switch circuitry to be non-conductive when the accident detection circuitry detects the accident, and
      to output the control signal for setting the semiconductor switch circuitry to be non-conductive when the zero point detection circuitry detects the current zero point in response to a command to cut off the current.

2. The semiconductor circuit breaker according to claim 1, wherein the accident detection circuitry determines that the accident has occurred when a current value or an amount of change of the current value is more than or equal to a threshold value based on the current detected from the AC circuit.

3. A semiconductor circuit breaker comprising:
   semiconductor switch circuitry connected to an AC circuit, and controlled to be conductive or non-conductive based on a control signal;
   accident detection circuitry to detect an accident based on a current detected from the AC circuit;
   zero point detection circuitry to detect a current zero point based on the current detected from the AC circuit; and
   control signal output circuitry to
      output the control signal for setting the semiconductor switch circuitry to be non-conductive when the accident detection circuitry detects the accident, and
      output the control signal for setting the semiconductor switch circuitry to be non-conductive when the zero point detection circuitry detects the current zero point in response to a command to cut off the current, wherein
   the semiconductor circuit breaker includes the semiconductor switch circuitry, the accident detection circuitry, the zero point detection circuitry, and the control signal output circuitry to correspond to each phase of the AC circuit, wherein
   the accident detection circuitry for at least one phase outputs the command to cut off the current when the accident detection circuitry detects the accident,
   the control signal output circuitry for the phase in which the accident has been detected outputs the control signal for setting the semiconductor switch circuitry for the phase in which the accident has been detected to be non-conductive, and
   the control signal output circuitry for another phase outputs the control signal for setting the semiconductor switch circuitry for the other phase to be non-conductive when the zero point detection circuitry for the another phase detects the current zero point in response to the command to cut off the current from the accident detection circuitry for the phase in which the accident has been detected.

4. A semiconductor circuit breaker comprising:
a semiconductor switch circuitry connected to an AC circuit, and having a semiconductor element controlled to be conductive or non-conductive by a control signal;
an accident detection circuitry to detect an accident based on a current detected from the AC circuit;
a zero point detection circuitry to detect a current zero point based on the current detected from the AC circuit, and estimate a subsequent current zero point subsequent to the detected current zero point and a delay time related to output of the control signal; and
a control signal output circuitry to
output the control signal for setting the semiconductor switch circuitry to be non-conductive when the accident detection circuitry detects the accident, and
to output the control signal for setting the semiconductor switch circuitry to be non-conductive when the current reaches the subsequent current zero point based on the delay time in response to a command to cut off the current.

5. The semiconductor circuit breaker according to claim 1, wherein the accident detection circuitry includes
an amplifier to obtain a current signal from the current detected from the AC circuit and convert the current signal into a voltage signal, and
a comparator to compare the voltage signal with a threshold value and output a signal indicating a comparison result, the threshold value being used to determine whether or not the accident has occurred.

6. The semiconductor circuit breaker according to claim 2, wherein the accident detection circuitry includes
an amplifier to obtain a current signal from the current detected from the AC circuit and convert the current signal into a voltage signal, and
a comparator to compare the voltage signal with a threshold value and output a signal indicating a comparison result, the threshold value being used to determine whether or not the accident has occurred.

7. The semiconductor circuit breaker according to claim 3, wherein the accident detection circuitry includes
an amplifier to obtain a current signal from the current detected from the AC circuit and convert the current signal into a voltage signal, and
a comparator to compare the voltage signal with a threshold value and output a signal indicating a comparison result, the threshold value being used to determine whether or not the accident has occurred.

8. The semiconductor circuit breaker according to claim 4, wherein the accident detection circuitry includes
an amplifier to obtain a current signal from the current detected from the AC circuit and convert the current signal into a voltage signal, and
a comparator to compare the voltage signal with a threshold value and output a signal indicating a comparison result, the threshold value being used to determine whether or not the accident has occurred.

9. The semiconductor circuit breaker according to claim 1, wherein the zero point detection circuitry includes
an amplifier to obtain a current signal from the current detected from the AC circuit and convert the current signal into a voltage signal,
a comparator to compare the voltage signal with a zero potential and output a signal indicating a comparison result, and
a NOT circuit to logically invert one of signals indicating the comparison result and output the logically inverted signal, the signals indicating the comparison result being outputted from the comparator with being branched into two.

10. The semiconductor circuit breaker according to claim 2, wherein the zero point detection circuitry includes
an amplifier to obtain a current signal from the current detected from the AC circuit and convert the current signal into a voltage signal,
a comparator to compare the voltage signal with a zero potential and output a signal indicating a comparison result, and
a NOT circuit to logically invert one of signals indicating the comparison result and output the logically inverted signal, the signals indicating the comparison result being outputted from the comparator with being branched into two.

11. The semiconductor circuit breaker according to claim 3, wherein the zero point detection circuitry includes
an amplifier to obtain a current signal from the current detected from the AC circuit and convert the current signal into a voltage signal,
a comparator to compare the voltage signal with a zero potential and output a signal indicating a comparison result, and
a NOT circuit to logically invert one of signals indicating the comparison result and output the logically inverted signal, the signals indicating the comparison result being outputted from the comparator with being branched into two.

12. The semiconductor circuit breaker according to claim 4, wherein the zero point detection circuitry includes
an amplifier to obtain a current signal from the current detected from the AC circuit and convert the current signal into a voltage signal,
a comparator to compare the voltage signal with a zero potential and output a signal indicating a comparison result, and
a NOT circuit to logically invert one of signals indicating the comparison result and output the logically inverted signal, the signals indicating the comparison result being outputted from the comparator with being branched into two.

13. The semiconductor circuit breaker according to claim 5, wherein the control signal output circuitry includes
latches to respectively hold signals outputted from the accident detection circuitry and the zero point detection circuitry, and
an AND circuit to output the control signal based on a logical conjunction of signals outputted from the latches.

14. The semiconductor circuit breaker according to claim 7, wherein the control signal output circuitry includes
latches to respectively hold signals outputted from the accident detection circuitry and the zero point detection circuitry, and
an AND circuit to output the control signal based on a logical conjunction of signals outputted from the latches.

15. The semiconductor circuit breaker according to claim 5, wherein the control signal output circuitry includes
a latch to hold a signal outputted from the accident detection circuitry,
a D latch to hold a command signal for cutting off the current in response to a signal outputted from the zero point detection circuitry, and an AND circuit to output the control signal based on a logical conjunction of signals outputted from the latch and the D latch.

16. The semiconductor circuit breaker according to claim 7, wherein the control signal output circuitry includes
a latch to hold a signal outputted from the accident detection circuitry,
a D latch to hold a command signal for cutting off the current in response to a signal outputted from the zero point detection circuitry, and
an AND circuit to output the control signal based on a logical conjunction of signals outputted from the latch and the D latch.

17. A circuit breaking device comprising:
the semiconductor circuit breaker according to claim 1 connected to branch lines branched from a bus connected to a power supply; and
a current limiter connected in parallel with a master switch connected to the bus.

18. A circuit breaking device comprising:
the semiconductor circuit breaker according to claim 2 connected to branch lines branched from a bus connected to a power supply; and
a current limiter connected in parallel with a master switch connected to the bus.

19. A circuit breaking device comprising:
the semiconductor circuit breaker according to claim 3 connected to branch lines branched from a bus connected to a power supply; and
a current limiter connected in parallel with a master switch connected to the bus.

20. A circuit breaking device comprising:
the semiconductor circuit breaker according to claim 4 connected to branch lines branched from a bus connected to a power supply; and
a current limiter connected in parallel with a master switch connected to the bus.

* * * * *